United States Patent
Aoki et al.

(10) Patent No.: US 10,435,601 B2
(45) Date of Patent: Oct. 8, 2019

(54) ADHESIVE AGENT AND CONNECTION STRUCTURE

(71) Applicant: DEXERIALS CORPORATION, Tokyo (JP)

(72) Inventors: Masaharu Aoki, Tochigi (JP); Shiyuki Kanisawa, Tochigi (JP); Hidetsugu Namiki, Tochigi (JP); Akira Ishigami, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 2 days.

(21) Appl. No.: 15/301,836

(22) PCT Filed: May 22, 2015

(86) PCT No.: PCT/JP2015/064746
§ 371 (c)(1),
(2) Date: Oct. 4, 2016

(87) PCT Pub. No.: WO2015/178482
PCT Pub. Date: Nov. 26, 2015

(65) Prior Publication Data
US 2017/0114255 A1    Apr. 27, 2017

(30) Foreign Application Priority Data

May 23, 2014 (JP) .................................. 2014-107167
May 23, 2014 (JP) .................................. 2014-107168

(51) Int. Cl.
*C09J 163/00* (2006.01)
*C09J 11/04* (2006.01)
(Continued)

(52) U.S. Cl.
CPC ............ *C09J 163/00* (2013.01); *C09J 11/04* (2013.01); *C09J 11/06* (2013.01); *C09J 133/00* (2013.01);
(Continued)

(58) Field of Classification Search
CPC . C09J 163/00; C09J 11/04; C09J 11/06; C09J 133/00; C09J 133/04; H01R 11/01;
(Continued)

(56) References Cited

U.S. PATENT DOCUMENTS

2004/0109943 A1* 6/2004 Matsushima ........ C08G 59/188
427/212
2009/0275708 A1* 11/2009 Kamiya ................ C08G 59/70
525/452

(Continued)

FOREIGN PATENT DOCUMENTS

CN       101536185 A    9/2009
JP      2010-024301 A    2/2010
(Continued)

OTHER PUBLICATIONS

Aug. 25, 2015 Search Report issued in International Patent Application No. PCT/JP2015/064746.
(Continued)

*Primary Examiner* — David T Karst
(74) *Attorney, Agent, or Firm* — Oliff PLC

(57) ABSTRACT

An adhesive agent having excellent bonding properties with oxide films and excellent heat-dissipation properties and a connection structure using the same. The adhesive agent contains an epoxy compound, a cationic catalyst, and an acrylic resin containing acrylic acid and acrylic acid ester having a hydroxyl group. Acrylic acid in the acrylic resin reacts with the epoxy compound to generate connections between an island of acrylic resin and a sea of epoxy
(Continued)

compound and roughen the surface of an oxide film to improve an anchor effect with the sea of epoxy compound; solder particles contained in the adhesive agent are melted to form metal bonding with an electrode, thereby enabling improvement in adhesive strength between the adhesive agent and the electrode and further improving heat dissipation from a surface of the metal bonding.

32 Claims, 6 Drawing Sheets

(51) Int. Cl.

| | | |
|---|---|---|
| C09J 11/06 | (2006.01) | |
| C09J 133/00 | (2006.01) | |
| C09J 133/04 | (2006.01) | |
| H01R 11/01 | (2006.01) | |
| H05K 3/32 | (2006.01) | |
| H05K 3/34 | (2006.01) | |
| H05K 1/02 | (2006.01) | |
| H05K 1/11 | (2006.01) | |
| H05K 1/18 | (2006.01) | |
| H05K 3/38 | (2006.01) | |

(52) U.S. Cl.
CPC ............ *C09J 133/04* (2013.01); *H01R 11/01* (2013.01); *H05K 1/0203* (2013.01); *H05K 1/11* (2013.01); *H05K 1/181* (2013.01); *H05K 3/32* (2013.01); *H05K 3/34* (2013.01); *H05K 3/386* (2013.01); *H05K 2201/10106* (2013.01)

(58) Field of Classification Search
CPC .......... H05K 3/32; H05K 3/34; H05K 1/0203; H05K 1/11; H05K 1/181; H05K 3/386; H05K 2201/10106
USPC ........................................................ 523/440
See application file for complete search history.

(56) References Cited

U.S. PATENT DOCUMENTS

| | | | | |
|---|---|---|---|---|
| 2011/0006441 | A1* | 1/2011 | Terai | C09D 133/062 257/777 |
| 2011/0108878 | A1* | 5/2011 | Namiki | C09J 9/02 257/99 |
| 2011/0180939 | A1* | 7/2011 | Sasaki | C08L 33/10 257/783 |
| 2012/0058625 | A1* | 3/2012 | Amano | H01L 21/67092 438/464 |
| 2012/0213993 | A1* | 8/2012 | Takeda | C08G 77/14 428/355 EP |
| 2012/0227786 | A1* | 9/2012 | Hayashi | C09J 9/02 136/244 |
| 2012/0255766 | A1 | 10/2012 | Igarashi | |
| 2013/0258632 | A1 | 10/2013 | Ebe et al. | |

FOREIGN PATENT DOCUMENTS

| | | |
|---|---|---|
| JP | 2010-226140 A | 10/2010 |
| JP | 2012-186322 A | 9/2012 |
| JP | 2013-054852 A | 3/2013 |
| JP | 2013-202632 A | 10/2013 |
| JP | 2013-221143 A | 10/2013 |
| JP | 2014-078480 A | 5/2014 |
| TW | 201000586 A | 1/2010 |
| TW | 201017738 A | 5/2010 |
| TW | 201414385 A | 4/2014 |
| WO | 2008/123087 A1 | 10/2008 |
| WO | 2014/046089 A1 | 3/2014 |
| WO | 2014/046093 A1 | 3/2014 |

OTHER PUBLICATIONS

Jan. 21, 2019 Office Action issued in Chinese Patent Application No. 201580026911.4.

* cited by examiner

ADHESIVE AGENT AND CONNECTION STRUCTURE

TECHNICAL FIELD

The present disclosure relates to an adhesive agent for electrically connecting respective electronic components, and more particularly relates to an adhesive agent for connecting a heat-generating electronic component to a wiring board along with dissipating heat of the electronic component and a connection structure in which the electronic component is connected to the wiring board. This application claims priority to Japanese Patent Application No. 2014-107167 filed on May 23, 2014 and Japanese Patent Application No. 2014-107168 filed on May 23, 2014, the entire contents of which are hereby incorporated by reference.

BACKGROUND ART

As an approach for mounting chip components such as LEDs to circuit substrates, methods of flip-chip mounting using anisotropic conductive film (ACF) formed by film-forming an epoxy adhesive agent in which conductive particles are dispersed have been widely employed (for example, refer to PLT 1 and 2). Because electrical connection between the chip component and the circuit substrate is accomplished by conductive particles of the anisotropic conductive film, such a method enables shortening of connection processes and improvements in production efficiency.

PRIOR ART LITERATURE

Patent Literatures

PLT 1: Japanese Unexamined Patent Application Publication No. 2010-24301
PLT 2: Japanese Unexamined Patent Application Publication No. 2012-186322

SUMMARY OF THE INVENTION

Problem to be Solved by the Invention

Among LED products in recent years, in order to reduce costs, there have been products in which metal of wiring of circuit substrates is changed from Au and Ag to Al and Cu as well as products using transparent substrates comprising ITO (indium tin oxide) wiring formed onto PET (polyethylene terephthalate) base materials.

However, on surfaces of metal wiring such as Al and Cu as well as ITO wiring, formation of oxide such as passivation/oxide films has led to difficulties in bonding with conventional epoxy adhesive agents.

In addition to bonding difficulties, in order to sufficiently dissipate heat from a heat-generating electronic component such as an LED product, the adhesive agent must contain a heat-dissipating material; containing the heat-dissipating material lowers adhesive agent component content which leads to difficulties in maintaining sufficient adhesive strength.

Furthermore, materials such as inorganic fillers and metal fillers used as the heat-dissipating material added to the adhesive agent become spacers which preclude making the adhesive agent layer thin.

To solve the aforementioned problems in the conventional art, an object of the present disclosure is to provide an adhesive agent having excellent bonding properties with respect to oxide films and excellent heat-dissipation properties for dissipating heat from an electronic component to the exterior and a connection structure using the same.

Solution to Problem

In order to solve the aforementioned problems, an adhesive agent according to the present disclosure comprises a resin binder containing solder particles.

Furthermore, a connection structure according to the present disclosure comprises a substrate having a wiring pattern; an anisotropic conductive film formed on electrodes of the wiring pattern; and a heat-generating electronic component mounted on the anisotropic conductive film; wherein the anisotropic conductive film contains a resin binder and solder particles, and the solder particles are metal-bonded to terminal portions of the electronic component.

Still further, in order to solve the aforementioned problems, an adhesive agent according to the present disclosure comprises an alicyclic epoxy compound or a hydrogenated epoxy compound, a cationic catalyst, an acrylic resin having a weight-average molecular weight of 50,000 to 900,000 and solder particles; wherein the acrylic resin contains an acrylic acid at 0.5 to 10 wt % and an acrylic acid ester having a hydroxyl group at 0.5 to 10 wt %.

Yet further, a connection structure according to the present disclosure comprises: a substrate having a wiring pattern which has an oxide formed on a surface thereof; an anisotropic conductive film formed on electrodes of the wiring pattern; and an electronic component mounted on the anisotropic conductive film; wherein the anisotropic conductive film is a cured product of an anisotropic conductive adhesive containing an alicyclic epoxy compound or a hydrogenated epoxy compound, a cationic catalyst, an acrylic resin having a weight-average molecular weight of 50,000 to 900,000, conductive particles and solder particles, the acrylic resin containing an acrylic acid at 0.5 to 10 wt % and an acrylic acid ester having a hydroxyl group at 0.5 to 10 wt %.

Advantageous Effects of Invention

According to the present disclosure, by the solder particles in the resin binder metal bonding with terminal portions of the electronic component, in addition to obtaining excellent adhesive strength between an adhesive agent layer and the electronic component, heat generated within the electronic component diffuses into the metal bonded solder particles, thereby enabling increased heat dissipation efficiency. Furthermore, according to the present disclosure, blending the acrylic resin containing an acrylic acid ester having a hydroxyl group enables bonding with the entire cured product to an oxide film and achieves excellent adhesive strength along with sufficiently ensuring bonding strength with the solder particles.

DESCRIPTION OF EMBODIMENTS

Figure 1:
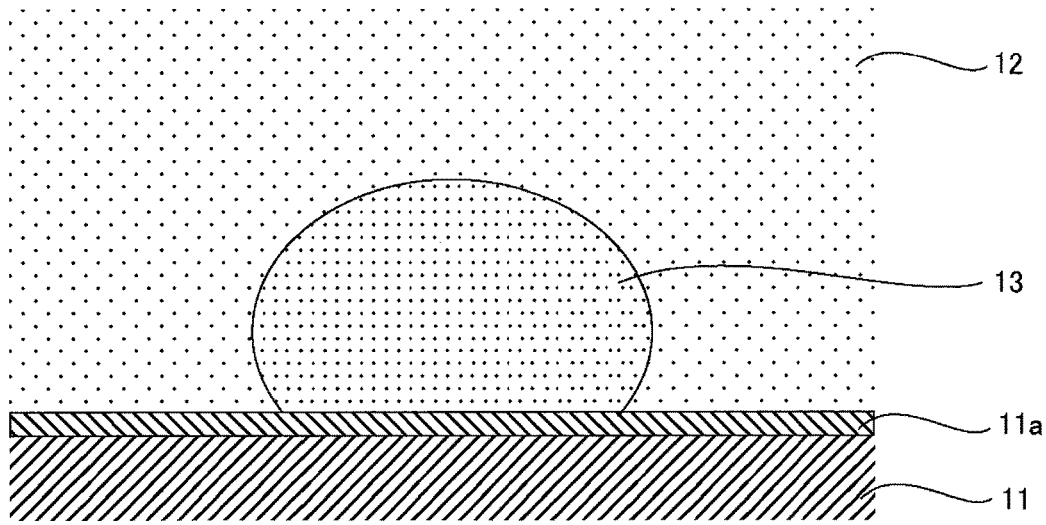
FIG. 1 is a cross-sectional view illustrating a sea-island model in the case of an epoxy compound being the sea component and an acrylic resin being the island component.

Embodiments of the present disclosure (hereinafter referred to as the present embodiments) will now be more particularly described according to the following order with reference to the accompanying drawings. It should be noted that the present disclosure is not limited to the embodiments described below and various modifications can be made without departing from the scope of the present disclosure. The features shown in the drawings are illustrated schematically and are not intended to be drawn to scale. Actual dimensions should be determined in consideration of the following description. Moreover, those skilled in the art will appreciate that dimensional relations and proportions may be different among the drawings in some parts.

1. Adhesive Agent
2. Connection Structure
3. Examples
   1. Adhesive Agent

An adhesive agent according to the present disclosure contains an alicyclic epoxy compound or a hydrogenated epoxy compound, a cationic catalyst, an acrylic resin having a weight-average molecular weight of 50,000 to 900,000 and solder particles; the acrylic resin contains an acrylic acid at 0.5 to 10 wt % and an acrylic acid ester having a hydroxyl group at 0.5 to 10 wt %.

FIG. 1. is a cross-sectional view illustrating a sea-island model of an interface of the adhesive agent and an oxide film with the epoxy compound as the sea and the acrylic resin as the island. This sea-island model is a cured product model illustrating a state of contact between an island of acrylic resin 13 dispersed in a sea of epoxy compound 12 and an oxide film 11a of a wiring 11.

In this cured product model, acrylic acid in the acrylic resin reacts with the epoxy compound which, in addition to generating connections between the island of acrylic resin 13 and the sea of epoxy compound 12, roughens the surface of the oxide film 11a such that an anchor effect with the sea of epoxy compound 12 is improved. Furthermore, the acrylic acid ester having a hydroxyl group contained in the acrylic resin achieves electrostatic adhesive strength with the wiring 11 due to the polarity of the hydroxyl group. Thus, with respect to the oxide film 11a, by bonding with the entire cured product of the island of acrylic resin 13 and the sea of epoxy compound 12, excellent adhesive strength is obtainable.

Figure 2:
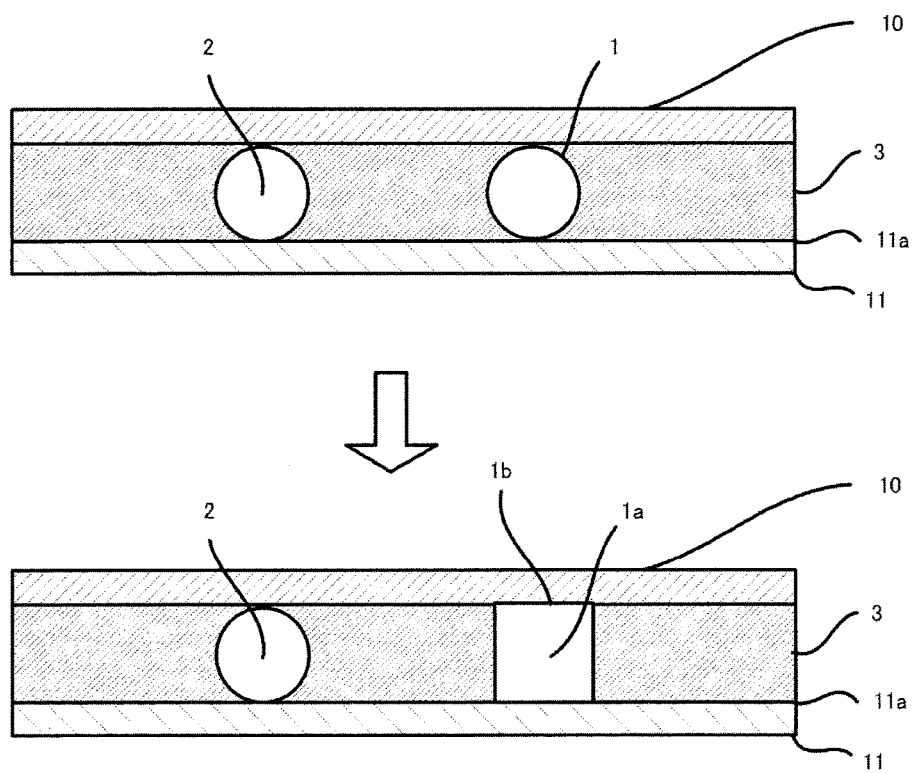
FIG. 2 is a cross-sectional view illustrating solder particles.

Next, the solder particles will be described. In particular, an example is used in describing in which the adhesive agent bonds an LED element with an aluminum wiring board having a wiring pattern having an oxidized surface. FIG. 2 is a cross-sectional view illustrating behavior of the solder particles contained in the adhesive agent.

Solder particles 1, as illustrated in FIG. 2, are added along with conductive particles 2, as will be described hereinbelow, into a resin binder 3 having the configuration described above. The solder particles 1 are dispersed along with the conductive particles 2 so as to be disposed between electrodes 10 of the LED element and the wiring 11 of the aluminum wiring board and are melted in a compression-bonding step to become a melted solder 1a.

Herein, the electrodes 10 of the LED element comprise Au or Au-Sn. The solder particles 1 melt when heated to or above a melting point and solidify into an approximately columnar shape when cooled to or below a solidifying point so that an end surface 1b on one side is metal bonded to the electrodes 10. However, metal bonding of the solder particles 1 to the wiring 11 is not possible. This is because existence of the oxide film 11a formed of aluminum oxide on the wiring 11 precludes metal bonding of the melted solder 1a to the wiring 11 of the aluminum wiring board in typical compression-bonding steps. Accordingly, the melted solder 1a does not contribute to electrical connection between the electrodes 10 of the LED element and the wiring 11.

However, due to metal bonding of the end surface 1b of the melted solder 1a and the electrodes 10, the electrodes 10 and the melted solder 1a are formed into one structure. Consequently, adhesive strength between the LED element and the adhesive agent is increased. In particular, in the case of the melted solder 1a not being present, the LED element 10 and the adhesive agent only make contact within a two-dimensional surface; however, the structure of the electrodes 10 of the LED element and the melted solder 1a has a three-dimensional configuration which results in increased bonding area between the electrodes 10 and the adhesive agent. Thus, the melted solder 1a bonded to a portion of the electrodes 10 functions as a pile (anchor) in the adhesive agent, thereby enabling bonding strength improvements between the electrodes 10 and the adhesive agent.

Furthermore, metal bonding of the melted solder 1a with the electrodes 10 leads to surface contact, in contrast to other particles used as heat-dissipating material which make point contact, enabling dissipation of heat from the LED element side via the melted solder 1a, and thus drastically improving heat-dissipation properties. Additionally, although the contact surface with the wiring 11 is via the oxide film 11a, surface contact of the melted solder 1a facilitates heat conduction, thereby enabling further improvements in heat-dissipation properties. It should be noted that comparison with other heat-dissipating materials will be further described in detail in the examples and comparative examples.

The solder particles 1 can be selected as appropriate in accordance with electrode material and connection conditions from, for example, as defined in JIS Z 3282-1999, Sn—Pb, Pb—Sn—Sb, Sn—Sb, Sn—Pb—Bi, Bi—Sn, Sn—Cu, Sn—Pb—Cu, Sn—In, Sn—Ag, Sn—Pb—Ag and Pb—Ag types, among others. In addition, shape of the solder particles 1 can be selected as appropriate from granular shapes and flake shapes, among others.

It should be noted that an average particle diameter (D50) of the solder particles 1 is preferably 3 or more and less than 30 μm and blending amount of the solder particles 1 is preferably 50 or more and less than 150 pts. mass. This is because if the blending amount is insufficient, the anchor effect described above cannot be expected; if the blending amount is excessive, there is relatively less of the resin binder 3, which degrades adhesive strength of the adhesive agent.

Furthermore, the solder particles 1 preferably have a melting point which is equal to or lower than a temperature for mounting. Using solder particles 1 having such a melting point enables fusing of the solder particles 1 by heating during mounting (compression-bonding step), thereby eliminating the need to add a heating step for the sole purpose of fusing the solder particles 1. Thus, the solder particles 1 can be melted with curing of the adhesive agent. Furthermore, formation of the melted solder 1a thus does not cause excessive heat stress in the LED element or substrate. For example, in the case of bonding an LED element to a resin substrate which uses aluminum wiring, in view of heat tolerance of the resin substrate and in order to mount at 180° C., a melting point of 180° C. or less is preferable in this case.

Next, preferable examples of alicyclic epoxy compounds having two or more epoxy groups per molecule will be given. These may be in a liquid or solid state. In particular, examples include 3,4-epoxycyclohexenylmethyl-3', 4'-epoxycyclohexene carboxylate and glycidyl hexahydrobisphenol A. Among these, in view of ensuring cured product transparency appropriate for such purposes as mounting an LED element and excellent rapid curing properties, 3,4-epoxycyclohexenylmethyl-3', 4'-epoxycyclohexene carboxylate is preferably used.

As a hydrogenated epoxy compound, hydrogenated products of the above-described alicyclic epoxy compounds as well as known hydrogenated epoxy compounds such as bisphenol A types and bisphenol F types, among others, may be used.

Alicyclic epoxy compounds and hydrogenated epoxy compounds may be used individually or in a combination of two or more. In addition to these epoxy compounds, so long as effects of the present disclosure are not impaired, other epoxy compounds may be additionally used. Examples include glycidyl ethers obtained by reacting epichlorohydrin with polyhydric phenols such as bisphenol A, bisphenol F, bisphenol S, tetramethyl bisphenol A, diaryl bisphenol A, hydroquinone, catechol, resorcinol, cresol, tetrabromobisphenol A, trihydroxybiphenyl, benzophenone, bisresorcinol, bisphenol hexaflouroacetone, tetramethyl bisphenol A, tetramethyl bisphenol F, tris(hydroxyphenyl)methane, bixylenol, phenol novolac, and cresol novalac; polyglycidyl ethers obtained by reacting epichlorohydrin with polyhydric aliphatic alcohols such as glycerin, neopentyl glycol, ethylene glycol, propylene glycol, butylene glycol, hexylene glycol, polyethylene glycol and polypropylene glycol; glycidyl ether esters obtained by reacting epichlorohydrin with hydroxycarboxlic acids such as p-oxybenzoic acid and β-oxynaptholic acid; polyglycidyl esters obtained from polycarboxylic acids such as phthalic acid, methylpthalic acid, isopthalic acid, terephtalic acid, tetrahydrophtalic acid, endomethylene tetrahydrophthalic acid, endo-methylene hexahydrophthalic acid, trimellitic acid, and polymerized fatty acids; glycidyl amino glycidyl ethers obtained from aminophenol or amino alkylphenol; glycidyl amino glycidyl ester obtained from aminobenzoic acid; glycidylamines obtainable from substances such as aniline, toluidine, tribromoaniline, xylylenediamine, diaminocyclohexane, bis (aminomethyl)cyclohexane, 4,4'-diaminodiphenylmethane and 4,4'-diaminodiphenylsulfone; and epoxified polyolefin, among other known epoxy resins.

Examples of cationic catalyst include latent cationic curing agents such as aluminum chelate-type latent curing agent, imidazole-type latent curing agent and sulfonium-type latent curing agent. Among these, aluminum chelate-type latent curing agent having excellent rapid curing properties is preferably used.

Insufficient content of the cationic catalyst leads to a loss of reactivity and excessive content tends to reduce product lifetime; content of the cationic catalyst with respect to 100 pts. mass of epoxy compound is preferably 0.1 to 30 pts. mass and more preferably 0.5 to 20 pts. mass.

The acrylic resin has a weight-average molecular weight of 50,000 to 900,000. Referring to the cured product model illustrated in FIG. 1, size of the island of acrylic resin 13 relates to the weight-average molecular weight of the acrylic resin, a weight-average molecular weight of the acrylic resin of 50,000 to 900,000 enables the island of acrylic resin 13 brought into contact with the oxide film 11a to be an appropriate size. In the case of the weight-average molecular weight of the acrylic resin being less than 50,000, contact surface area of the island of acrylic resin 13 with the oxide film 11a is small and adhesive strength improvement effects are unobtainable. In the case of the weight-average molecular weight of the acrylic resin exceeding 900,000, the island of acrylic resin 13 is large and the cured product of the island of acrylic resin 13 and the sea of epoxy compound 12 is not bonded as an entirety to the oxide film 11a, thus degrading adhesive strength.

Furthermore, the acrylic resin contains the acrylic acid at 0.5 to 10 wt % and more preferably at 1 to 5 wt %. By content of acrylic acid in the acrylic resin being 0.5 to 10 wt %, in addition to reaction with the epoxy compound generating connections between the island of acrylic resin 13 and the sea of epoxy compound 12, the surface of the oxide film 11a is roughened so as to improve the anchor effect with the sea of epoxy compound 12.

Still further, the acrylic resin contains acrylic acid ester having a hydroxyl group at 0.5 to 10 wt % and more preferably at 1 to 5 wt %. By content of the acrylic acid ester having a hydroxyl group in the acrylic resin being 0.5 to 10 wt %, electrostatic adhesive force with the wiring 11 is obtained due to polarity of the hydroxyl group.

Examples of acrylic acid ester having a hydroxyl group include 2-hydroxyethyl methacrylate, 2-hydroxypropyl methacrylate, 2-hydroxyethyl acrylate and 2-hydroxypropyl acrylate. Among these, 2-hydroxyethyl methacrylate having excellent adhesive strength with oxide films is preferably used.

Moreover, in addition to acrylic acid and acrylic acid ester having a hydroxyl group, the acrylic resin contains acrylic acid ester without a hydroxyl group. Examples of acrylic acid ester without a hydroxyl group include butyl acrylate, ethyl acrylate and acrylonitrile.

Furthermore, content of the acrylic resin with respect to 100 pts. mass of the epoxy compound is preferably 1 to 10 pts. mass and more preferably 1 to 5 pts. mass. By content of the acrylic resin with respect to 100 pts. mass of the epoxy compound being 1 to 10 pts. mass, it is possible to obtain a cured product in which the island of acrylic resin 13 is dispersed at a favorable density in the sea of epoxy compound 12.

Furthermore, the adhesive agent according to the present disclosure may additionally contain a silane coupling agent as an additional component to improve adhesion at interfaces with inorganic materials. Examples of silane coupling agent include epoxy-type, methacryloxy-type, amino-type, vinyl-type, mercapto/sulfide-type and ureido-type, among others; these may be used individually or in a combination of two or more. Among these, in the present embodiments, an epoxy-type silane coupling agent is preferably used.

Furthermore, the adhesive agent may contain an inorganic filler to control fluidity and improve particle trapping rates. Examples of usable inorganic fillers include, without particular limitation, silica, talc, titanium oxide, calcium carbonate and magnesium oxide, among others. Such an inorganic filler may be used as appropriate according to stress relief purposes in the connection structure connected by the adhesive agent. Moreover, softeners such as thermoplastic resins and rubber components may also be blended.

According to such an adhesive agent, high adhesive strength with respect to difficult to bond metals such as aluminum can be obtained.

Moreover, the adhesive agent may be an anisotropic conductive adhesive agent containing conductive particles. As the conductive particles, known conductive particles may be used. Examples include particles of metals or metal alloys such as those of nickel, iron, copper, aluminum, tin, lead, chromium, cobalt, silver or gold and particles such as those of metal oxides, carbon, graphite, glass, ceramic and plastic coated with metal, or these particles having a further coating of a thin electrically-insulating film, among others. In the case of coating a metal to the surface of resin particles, examples of usable resin particles include those of epoxy resin, phenol resin, acrylic resin, acrylonitrile-styrene (AS) resin, benzoguanamine resin, divinylbenzene-type resin and styrene-type resin, among others.

The average particle diameter of the conductive particles is typically 1 to 10 μm and more preferably 2 to 6 μm. Furthermore, average particle density of the conductive particles in the adhesive agent component, in view of connection reliability and insulating properties, is preferably 1,000 to 100,000 particles/mm$^2$ and more preferably 30,000 to 80,000 particles/mm$^2$. Herein, content of the conductive particles is preferably 1 to 20 pts. mass.

According to such an anisotropic conductive adhesive agent, high connection reliability can be obtained with respect to an aluminum wiring having an oxide film or ITO wiring.

2. Connection Structure

Figure 3:
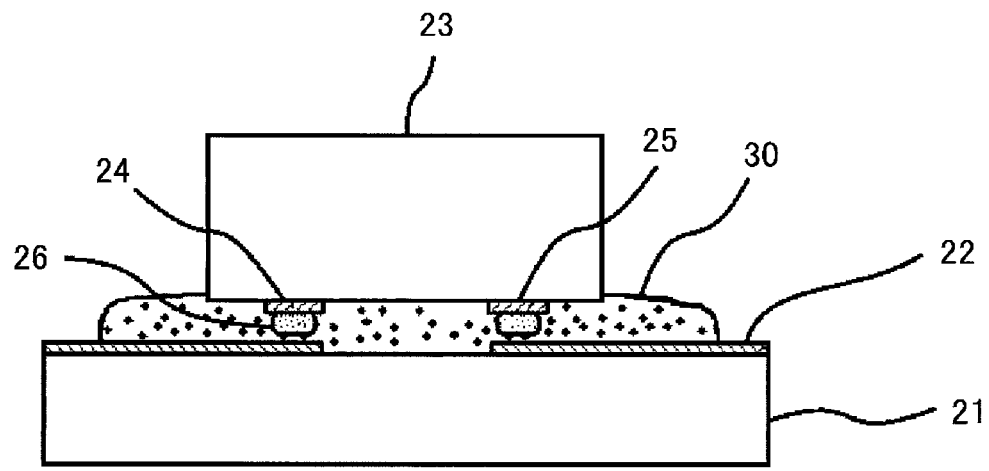
FIG. 3 is a cross-sectional view illustrating one example of a light-emitting device.

Next, a connection structure according to the present disclosure will be described. FIG. 3 is a cross-sectional view illustrating an LED element which is a heat-generating electronic component as one example of a connection structure. The connection structure comprises a substrate 21 having a wiring pattern 22, an anisotropic conductive film 30 formed on electrodes of the wiring pattern 22, and a light-emitting element 23 mounted on the anisotropic conductive film 30; the anisotropic conductive film 30 comprises a cured product of the anisotropic conductive adhesive agent described above. This light-emitting device is obtained by applying the anisotropic conductive adhesive agent described above between the wiring pattern 22 on the substrate 21 and connection-use bumps 26 formed on each of an n-electrode 24 and a p-electrode 25 of an LED element as the light-emitting element 23 and flip-chip mounting the light-emitting element 23 to the substrate 21.

It should be noted that the bumps 26 described herein have a plating such as of Au or Au—Sn alloy. Accordingly, the bumps 26 correspond to the electrodes 10 illustrated in FIG. 2, and the solder particles 1 are metal bonded to the bumps 26.

In the present embodiments, by using the above-described anisotropic conductive adhesive agent, a substrate having a wiring pattern comprising aluminum can be favorably used. Cost reductions for LED products are thereby enabled.

Furthermore, transparent substrates having a transparent conductive film such as those of ITO can be favorably used. For example, it is thus possible to mount an LED element to a transparent resin substrate in which ITO (indium tin oxide) wiring is formed onto a PET (polyethylene terephthalate) base material.

It should be noted that, according to need, the light-emitting element 23 may be entirely covered by sealing with a transparent molded resin having good heat-dissipation properties. Furthermore, a light reflecting layer may be provided in the light-emitting element 23. Still further, as the light-emitting element, in addition to LED elements, so long as the effects of the present disclosure are not impaired, known heat-generating electronic components may be used.

3. Examples

First Examples

Next, a first set of examples according to the present disclosure will be described. In these examples, each variety of anisotropic conductive adhesive agent was manufactured and LED mounting samples were manufactured in which LED elements were mounted onto substrates using these anisotropic conductive adhesive agents; existence of alloy formation between the terminal portions of the LED elements and the solder particles, thermal resistance and adhesive strength with aluminum were evaluated. It should be noted that the present disclosure is not limited to these examples.

Peel Strength Measurement

Anisotropic conductive adhesive agent was applied at a thickness of 100 μm onto a white plate comprising ceramic to which a 1.5×10 mm aluminum piece was thermocompression bonded under conditions of 180° C., 1.5 N and 30 sec to manufacture bonded structures.

Figure 4:
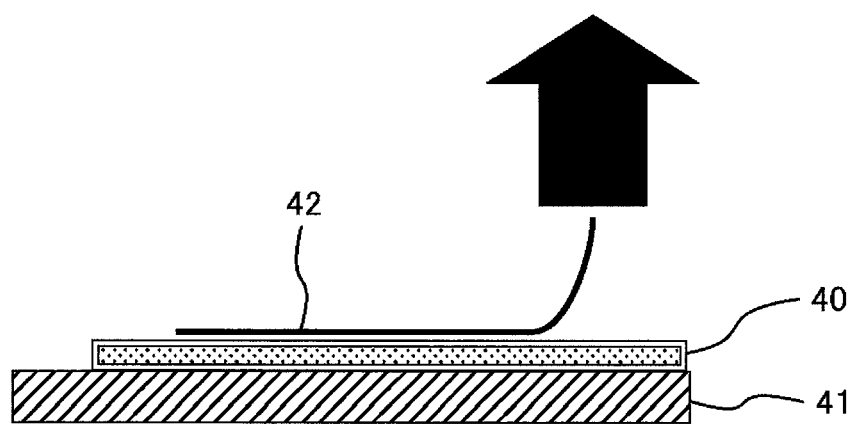
FIG. 4 is a cross-sectional schematic view illustrating a 90-degree peel strength test.

As illustrated in FIG. 4, using a TENSILON, the aluminum pieces of the bonded structures were peeled at a peel speed of 50 mm/sec in the 90° y-axis direction, and the maximum peel strength required to peel was measured.

LED Mounting Sample Manufacturing

Figure 5:
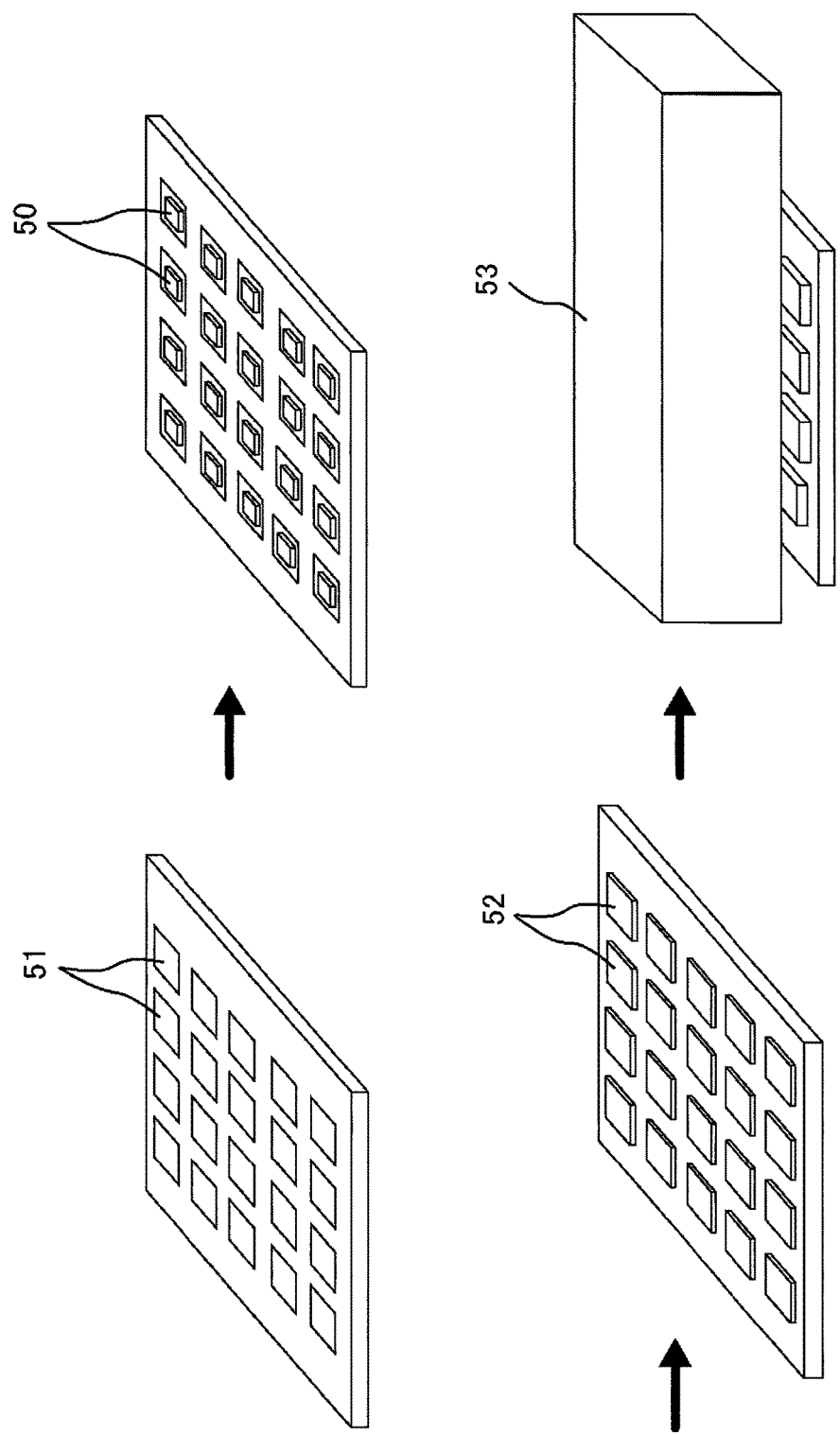
FIG. 5 is a view illustrating a manufacturing process of an LED mounting sample.

As illustrated in FIG. 5, LED mounting samples were manufactured. A plurality of wiring boards 51 having a 50 μm pitch (50 μm Al wiring, 25 μm PI (polyimide) layer and 50 μm Al base) were arranged onto a stage, and 10 μg of an anisotropic conductive adhesive agent 50 was applied to each of the wiring boards 51. Onto the anisotropic conductive adhesive agent 50, LED chips 52 manufactured by Cree, Inc. (trade name: DA3547, maximum rating: 150 mA, size: 0.35×0.46 mm) were mounted, a thermocompression tool 53 was used in flip-chip mounting to obtain LED mounting samples.

Die Shear Strength Measurement

Figure 6:
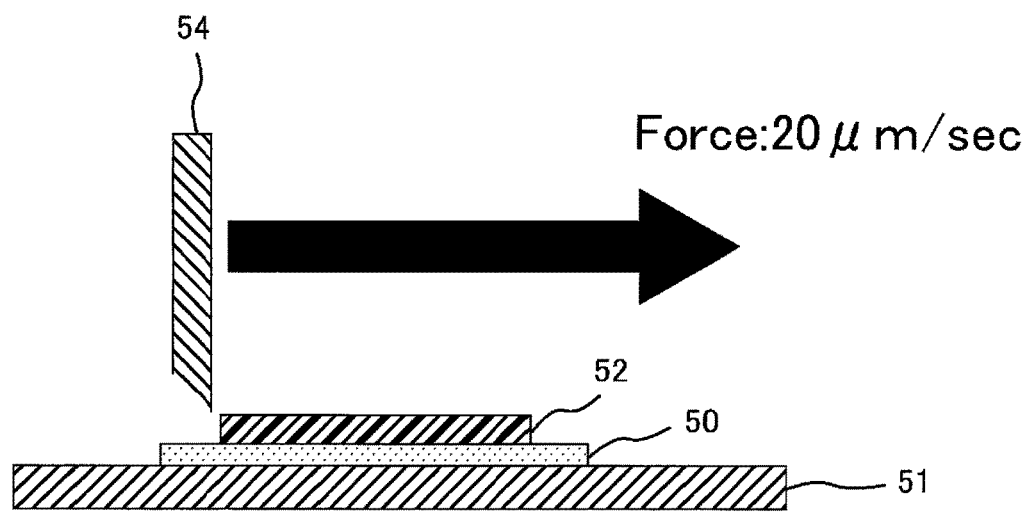
FIG. 6 is a cross-sectional schematic view illustrating a die shear strength test.

As illustrated in FIG. 6, bonding strength of each of the LED mounting samples was measured by using a die shear strength tester under conditions of 25° C. and a shearing velocity of 20 μm/sec for a tool 54.

Presence of Alloy Formation Evaluation

Appearances of each of the LED mounting samples were inspected by using a microscope (SEM: scanning electron microscope), to determine the occurrence of alloy formation between the electrode portions of the LED elements and solder particles. In particular, if alloy formation occurs, surface contact occurs between the electrode portions and the solder particles due to the melted solder. Occurrence of alloy formation, thus metal bonding, can be determined by observing the area over which melted solder has spread.

Thermal Resistance Evaluation

Using a transient thermal resistance measurement device (manufactured by CATS Inc.), thermal resistances (° C./W)

of the LED mounting bodies were measured. Measurement conditions were If=200 mA (constant current control).

Overall Evaluation

Samples evaluated as "good" (hereinafter referred to as "G") for both presence of alloy formation of the solder particles with the terminal portions of the LED elements and thermal resistance in addition to having a peel strength of 2.0 N or more and a die sheer strength of 5.0 N or more were evaluated as OK and otherwise evaluated as "not good" (hereinafter referred to as "NG").

Example 1

Into an adhesive agent comprising 100 pts. mass of alicyclic epoxy compound (product name: CELLOXIDE 2021P, manufacturer: DAICEL CORPORATION), 5 pts. mass latent cationic curing agent (aluminum chelate-type latent curing agent) and 3 pts. mass of acrylic resin (15 wt % butyl acrylate (BA), 63 wt % ethyl acrylate (EA), 20 wt % acrylonitrile (AN), 1 wt % acrylic acid (AA) and 1 wt % 2-hydroxyethyl methacrylate (HEMA), weight-average molecular weight: 700,000), 30 pts. mass solder particles having a solder melting point of 150° C. and 10 pts. mass conductive particles (product name. AUL 704, manufacturer: SEKISUI CHEMICAL CO., LTD.) were dispersed to manufacture an anisotropic conductive adhesive agent. Furthermore, curing conditions in manufacturing LED mounting samples were 180° C., 1.5 N and 30 sec.

It should be noted that solder particles used in each of the examples had an average particle diameter of 5 µm, 7 µm, 10 µm, 12 µm and 25 µm. Because no significant difference was found between particle diameters in the above-described range, results for individual particle diameters have been omitted; however, the results of the present examples can be obtained by using particle diameters that are at least within the above-described range. This is also the same in the following examples and comparative examples in which solder particles are blended.

Each evaluation result for Example 1 is represented in Table 1. Alloy formation was confirmed, thermal resistance was 17 (K/W), and peel strength was 4.0 N. Furthermore, die sheer strength of the LED mounting samples was 8.5 N. Accordingly, overall evaluation was OK.

Example 2

Other than that solder particles having a melting point of 150° C. were blended at 40 pts. mass, an anisotropic conductive adhesive agent was manufactured as in Example 1.

Each evaluation result for Example 2 is represented in Table 1. Alloy formation was confirmed, thermal resistance was 16 (K/W), and peel strength was 4.0 N. Furthermore, die sheer strength of the LED mounting samples was 8.5 N. Accordingly, overall evaluation was OK.

Example 3

Other than that solder particles having a melting point of 150° C. were blended at 60 pts. mass, an anisotropic conductive adhesive agent was manufactured as in Example 1.

Each evaluation result for Example 3 is represented in Table 1. Alloy formation was confirmed, thermal resistance was 16 (K/W), and peel strength was 4.0 N. Furthermore, die sheer strength of the LED mounting samples was 8.5 N. Accordingly, overall evaluation was OK.

Example 4

Other than that solder particles having a melting point of 150° C. were blended at 80 pts. mass, an anisotropic conductive adhesive agent was manufactured as in Example 1.

Each evaluation result for Example 4 is represented in Table 1. Alloy formation was confirmed, thermal resistance was 15 (K/W), and peel strength was 4.0 N. Furthermore, die sheer strength of the LED mounting samples was 8.5 N. Accordingly, overall evaluation was OK.

Example 5

Other than that solder particles having a melting point of 170° C. were blended at 30 pts. mass, an anisotropic conductive adhesive agent was manufactured as in Example 1.

Each evaluation result for Example 5 is represented in Table 1. Alloy formation was confirmed, thermal resistance was 16 (K/W), and peel strength was 4.0 N. Furthermore, die sheer strength of the LED mounting samples was 8.5 N. Accordingly, overall evaluation was OK.

Example 6

Other than that solder particles having a melting point of 170° C. were blended at 80 pts. mass, an anisotropic conductive adhesive agent was manufactured as in Example 1.

Each evaluation result for Example 6 is represented in Table 1. Alloy formation was confirmed, thermal resistance was 16 (K/W), and peel strength was 4.0 N. Furthermore, die sheer strength of the LED mounting samples was 8.5 N. Accordingly, overall evaluation was OK.

Comparative Example 1

Other than that solder particles were not blended, an anisotropic conductive adhesive agent was manufactured as in Example 1.

Each evaluation result for Comparative Example 1 is represented in Table 1. Alloy formation was not confirmed, thermal resistance was 29 (K/W), and peel strength was 4.0 N. Furthermore, die sheer strength of the LED mounting samples was 8.5 N. Accordingly, overall evaluation was NG.

Comparative Example 2

Other than that solder particles having a melting point of 150° C. were blended at 160 pts. mass, an anisotropic conductive adhesive agent was manufactured as in Example 1.

Each evaluation result for Comparative Example 2 is represented in Table 1. Alloy formation was confirmed, thermal resistance was 16 (K/W), and peel strength was 1.2 N. Furthermore, die sheer strength of the LED mounting samples was 2.0 N. Accordingly, overall evaluation was NG.

Comparative Example 3

Other than that solder particles having a melting point of 170° C. were blended at 160 pts. mass, an anisotropic conductive adhesive agent was manufactured as in Example 1.

Each evaluation result for Comparative Example 3 is represented in Table 1. Alloy formation was confirmed, thermal resistance was 16 (K/W), and peel strength was 1.2 N. Furthermore, die sheer strength of the LED mounting samples was 2.0 N. Accordingly, overall evaluation was NG.

Comparative Example 4

Other than that solder particles having a melting point of 200° C. were blended at 30 pts. mass, an anisotropic conductive adhesive agent was manufactured as in Example 1.

Each evaluation result for Comparative Example 4 is represented in Table 1. Alloy formation was not confirmed, thermal resistance was 26 (K/W), and peel strength was 4.0 N. Furthermore, die sheer strength of the LED mounting samples was 8.5 N. Accordingly, overall evaluation was NG.

Comparative Example 5

Other than that solder particles having a melting point of 200° C. were blended at 80 pts. mass, an anisotropic conductive adhesive agent was manufactured as in Example 1.

Each evaluation result for Comparative Example 5 is represented in Table 1. Alloy formation was not confirmed, thermal resistance was 23 (K/W), and peel strength was 4.0 N. Furthermore, die sheer strength of the LED mounting samples was 8.5 N. Accordingly, overall evaluation was NG.

Comparative Example 6

Other than that solder particles having a melting point of 200° C. were blended at 160 pts. mass, an anisotropic conductive adhesive agent was manufactured as in Example 1.

Each evaluation result for Comparative Example 6 is represented in Table 1. Alloy formation was not confirmed, thermal resistance was 23 (K/W), and peel strength was 1.2 N. Furthermore, die sheer strength of the LED mounting samples was 2.0 N. Accordingly, overall evaluation was NG.

Comparative Example 7

Other than that an aluminum oxide powder, which is a heat-dissipating material, having an average particle diameter of 0.4 μm was blended at 60 pts. mass instead of solder particles, an anisotropic conductive adhesive agent was manufactured as in Example 1.

Each evaluation result for Comparative Example 7 is represented in Table 2. Alloy formation was not confirmed, and thermal resistance was 25 (K/W). Furthermore, die sheer strength of the LED mounting samples was 8.5 N. Accordingly, overall evaluation was NG.

Comparative Example 8

Other than that an aluminum oxide powder, which is a heat-dissipating material, having an average particle diameter of 0.4 μm was blended at 150 pts. mass instead of solder particles, an anisotropic conductive adhesive agent was manufactured as in Example 1.

Each evaluation result for Comparative Example 8 is represented in Table 2. Alloy formation was not confirmed, and thermal resistance was 23 (K/W). Furthermore, die sheer strength of the LED mounting samples was 5.3 N. Accordingly, overall evaluation was NG.

Comparative Example 9

Other than that an aluminum oxide powder, which is a heat-dissipating material, having an average particle diameter of 3 μm was blended at 60 pts. mass instead of solder particles, an anisotropic conductive adhesive agent was manufactured as in Example 1.

Each evaluation result for Comparative Example 9 is represented in Table 2. Alloy formation was not confirmed, and thermal resistance was 29 (K/W). Furthermore, die sheer strength of the LED mounting samples was 8.8 N. Accordingly, overall evaluation was NG.

Comparative Example 10

Other than that an aluminum oxide powder, which is a heat-dissipating material, having an average particle diameter of 3 μm was blended at 150 pts. mass instead of solder particles, an anisotropic conductive adhesive agent was manufactured as in Example 1.

Each evaluation result for Comparative Example 10 is represented in Table 2. Alloy formation was not confirmed, and thermal resistance was 28 (K/W). Furthermore, die sheer strength of the LED mounting samples was 6.2 N. Accordingly, overall evaluation was NG.

Comparative Example 11

Other than that an aluminum oxide powder, which is a heat-dissipating material, having an average particle diameter of 10 μm was blended at 60 pts. mass instead of solder particles, an anisotropic conductive adhesive agent was manufactured as in Example 1.

Each evaluation result for Comparative Example 11 is represented in Table 2. Alloy formation was not confirmed, and thermal resistance was 35 (K/W). Furthermore, die sheer strength of the LED mounting samples was 6.1 N. Accordingly, overall evaluation was NG.

Comparative Example 12

Other than that an aluminum oxide powder, which is a heat-dissipating material, having an average particle diameter of 10 μm was blended at 150 pts. mass instead of solder particles, an anisotropic conductive adhesive agent was manufactured as in Example 1.

Each evaluation result for Comparative Example 12 is represented in Table 2. Alloy formation was not confirmed, and thermal resistance was 33 (K/W). Furthermore, die sheer strength of the LED mounting samples was 5.5 N. Accordingly, overall evaluation was NG.

Comparative Example 13

Other than that an aluminum nitride powder, which is a heat-dissipating material, having an average particle diameter of 1.5 μm was blended at 60 pts. mass instead of solder particles, an anisotropic conductive adhesive agent was manufactured as in Example 1.

Each evaluation result for Comparative Example 13 is represented in Table 3. Alloy formation was not confirmed, and thermal resistance was 22 (K/W). Furthermore, die sheer strength of the LED mounting samples was 8.1 N. Accordingly, overall evaluation was NG.

Comparative Example 14

Other than that an aluminum nitride powder, which is a heat-dissipating material, having an average particle diameter of 1.5 μm was blended at 150 pts. mass instead of solder particles, an anisotropic conductive adhesive agent was manufactured as in Example 1.

Each evaluation result for Comparative Example 14 is represented in Table 3. Alloy formation was not confirmed, and thermal resistance was 19 (K/W). Furthermore, die sheer strength of the LED mounting samples was 5.9 N. Accordingly, overall evaluation was NG.

Comparative Example 15

Other than that an Ni powder, which is a heat-dissipating material, having an average particle diameter of 3 μm was blended at 60 pts. mass instead of solder particles, an anisotropic conductive adhesive agent was manufactured as in Example 1.

Each evaluation result for Comparative Example 13 is represented in Table 3. Alloy formation was not confirmed, and thermal resistance was 28 (K/W). Furthermore, die sheer strength of the LED mounting samples was 7.9 N. Accordingly, overall evaluation was NG.

Comparative Example 16

Other than that an Ni powder, which is a heat-dissipating material, having an average particle diameter of 3 μm was blended at 150 pts. mass instead of solder particles, an anisotropic conductive adhesive agent was manufactured as in Example 1.

Each evaluation result for Comparative Example 16 is represented in Table 3. Alloy formation was not confirmed, and thermal resistance was 27 (K/W). Furthermore, die sheer strength of the LED mounting samples was 6.0 N. Accordingly, overall evaluation was NG.

Comparative Example 17

Other than that a Cu powder, which is a heat-dissipating material, having an average particle diameter of 10 μm was blended at 60 pts. mass instead of solder particles, an anisotropic conductive adhesive agent was manufactured as in Example 1.

Each evaluation result for Comparative Example 17 is represented in Table 3. Alloy formation was not confirmed, and thermal resistance was 41 (K/W). Furthermore, die sheer strength of the LED mounting samples was 8.12 N. Accordingly, overall evaluation was NG.

Comparative Example 18

Other than that a Cu powder, which is a heat-dissipating material, having an average particle diameter of 10 μm was blended at 150 pts. mass instead of solder particles, an anisotropic conductive adhesive agent was manufactured as in Example 1.

Each evaluation result for Comparative Example 18 is represented in Table 3. Alloy formation was not confirmed, and thermal resistance was 38 (K/W). Furthermore, die sheer strength of the LED mounting samples was 6.2 N. Accordingly, overall evaluation was NG.

Comparative Example 19

Other than that a diamond powder, which is a heat-dissipating material, having an average particle diameter of 0.3 μm was blended at 60 pts. mass instead of solder particles, an anisotropic conductive adhesive agent was manufactured as in Example 1.

Each evaluation result for Comparative Example 19 is represented in Table 3. Alloy formation was not confirmed, and thermal resistance was 21 (K/W). Furthermore, die sheer strength of the LED mounting samples was 8.3 N. Accordingly, overall evaluation was NG.

Comparative Example 20

Other than that a diamond powder, which is a heat-dissipating material, having an average particle diameter of 0.3 μm was blended at 150 pts. mass instead of solder particles, an anisotropic conductive adhesive agent was manufactured as in Example 1.

Each evaluation result for Comparative Example 20 is represented in Table 3. Alloy formation was not confirmed, and thermal resistance was 22 (K/W). Furthermore, die sheer strength of the LED mounting samples was 8.1 N. Accordingly, overall evaluation was NG.

TABLE 1

| | | | Ex. 1 | Ex. 2 | Ex. 3 | Ex. 4 | Ex. 5 | Ex. 6 | Comp. 1 | Comp. 2 | Comp. 3 | Comp. 4 | Comp. 5 | Comp. 6 |
|---|---|---|---|---|---|---|---|---|---|---|---|---|---|---|
| Solder Melting Point 150° C. | Particle Diameter: 5 to 25 μm | 30 pts. mass | Blend | — | — | — | — | — | — | — | — | — | — | — |
| | | 40 pts. mass | — | Blend | — | — | — | — | — | — | — | — | — | — |
| | | 60 pts. mass | — | — | Blend | — | — | — | — | — | — | — | — | — |
| | | 80 pts. mass | — | — | — | Blend | — | — | — | — | — | — | — | — |
| | | 160 pts. mass | — | — | — | — | — | — | — | Blend | — | — | — | — |
| Solder Melting Point 170° C. | Particle Diameter: 5 to 25 μm | 30 pts. mass | — | — | — | — | Blend | — | — | — | — | — | — | — |
| | | 80 pts. mass | — | — | — | — | — | Blend | — | — | — | — | — | — |
| | | 160 pts. mass | — | — | — | — | — | — | — | — | Blend | — | — | — |
| Solder Melting Point 200° C. | Particle Diameter: 5 to 25 μm | 30 pts. mass | — | — | — | — | — | — | — | — | — | Blend | — | — |
| | | 80 pts. mass | — | — | — | — | — | — | — | — | — | — | Blend | — |
| | | 160 pts. mass | — | — | — | — | — | — | — | — | — | — | — | Blend |
| LED Solder Alloy Formation | | | G | G | G | G | G | G | F | G | G | Partial to F | Partial to F | Partial to F |
| Thermal Resistance (K/W) | | | 17 | 16 | 16 | 15 | 16 | 16 | 29 | 16 | 16 | 26 | 23 | 23 |

TABLE 1-continued

|  |  | Ex. 1 | Ex. 2 | Ex. 3 | Ex. 4 | Ex. 5 | Ex. 6 | Comp. 1 | Comp. 2 | Comp. 3 | Comp. 4 | Comp. 5 | Comp. 6 |
|---|---|---|---|---|---|---|---|---|---|---|---|---|---|
| Adhesive Strength to Aluminum | Die Shear Strength |  |  |  | 8.5N |  |  | 8.5N | 2.0N |  | 8.5N |  | 2.0N |
|  | 90 Degree Peel Strength |  |  |  | 4.5N |  |  | 4.0N | 1.2N |  | 4.0N |  | 1.2N |
|  | Overall Evaluation |  |  |  | OK |  |  |  |  |  | NG |  |  |

TABLE 2

|  |  |  | Ex. 4 | Comp. 1 | Comp. 7 | Comp. 8 | Comp. 9 | Comp. 10 | Comp. 11 | Comp. 12 |
|---|---|---|---|---|---|---|---|---|---|---|
| Solder Melting Point 150° C. | Particle Diameter: 10 μm | 80 pts. mass | Blend | — | — | — | — | — | — | — |
| Aluminum Oxide Powder | Particle Diameter: 0.4 μm | 60 pts. mass | — | — | Blend | — | — | — | — | — |
|  |  | 150 pts. mass | — | — | — | Blend | — | — | — | — |
|  | Particle Diameter: 3 μm | 60 pts. mass | — | — | — | — | Blend | — | — | — |
|  |  | 150 pts. mass | — | — | — | — | — | Blend | — | — |
|  | Particle Diameter: 10 μm | 60 pts. mass | — | — | — | — | — | — | Blend | — |
|  |  | 150 pts. mass | — | — | — | — | — | — | — | Blend |
| Aluminum Nitride Powder | Particle Diameter: 1.5 μm | 60 pts. mass | — | — | — | — | — | — | — | — |
|  |  | 150 pts. mass | — | — | — | — | — | — | — | — |
| Ni Powder | Particle Diameter: 3 μm | 60 pts. mass | — | — | — | — | — | — | — | — |
|  |  | 150 pts. mass | — | — | — | — | — | — | — | — |
| Cu Powder | Particle Diameter: 10 μm | 60 pts. mass | — | — | — | — | — | — | — | — |
|  |  | 150 pts. mass | — | — | — | — | — | — | — | — |
| Diamond Powder | Particle Diameter: 0.3 μm | 60 pts. mass | — | — | — | — | — | — | — | — |
|  |  | 150 pts. mass | — | — | — | — | — | — | — | — |
|  | LED Solder Alloy Formation |  | G | F | F | F | F | F | F | F |
|  | Thermal Resistance (K/W) |  | 15 | 29 | 25 | 23 | 29 | 28 | 35 | 33 |
| Adhesive Strength to Aluminum | Die Shear Strength |  | 8.5N | 8.5N | 8.6N | 6.3N | 8.8N | 6.2N | 8.1N | 5.5N |
|  | Overall Evaluation |  | OK |  |  |  | NG |  |  |  |

TABLE 3

|  |  |  | Comp. 13 | Comp. 14 | Comp. 15 | Comp. 16 | Comp. 17 | Comp. 18 | Comp. 19 | Comp. 20 |
|---|---|---|---|---|---|---|---|---|---|---|
| Solder Melting Point 150° C. | Particle Diameter: 10 μm | 80 pts. mass | — | — | — | — | — | — | — | — |
| Aluminum Oxide Powder | Particle Diameter: 0.4 μm | 60 pts. mass | — | — | — | — | — | — | — | — |
|  |  | 150 pts. mass | — | — | — | — | — | — | — | — |
|  | Particle Diameter: 3 μm | 60 pts. mass | — | — | — | — | — | — | — | — |
|  |  | 150 pts. mass | — | — | — | — | — | — | — | — |
|  | Particle Diameter: 10 μm | 60 pts. mass | — | — | — | — | — | — | — | — |
|  |  | 150 pts. mass | — | — | — | — | — | — | — | — |
| Aluminum Nitride Powder | Particle Diameter: 1.5 μm | 60 pts. mass | Blend | — | — | — | — | — | — | — |
|  |  | 150 pts. mass | — | Blend | — | — | — | — | — | — |
| Ni Powder | Particle Diameter: 3 μm | 60 pts. mass | — | — | Blend | — | — | — | — | — |
|  |  | 150 pts. mass | — | — | — | Blend | — | — | — | — |
| Cu Powder | Particle Diameter: 10 μm | 60 pts. mass | — | — | — | — | Blend | — | — | — |
|  |  | 150 pts. mass | — | — | — | — | — | Blend | — | — |

TABLE 3-continued

|  |  |  | Comp. 13 | Comp. 14 | Comp. 15 | Comp. 16 | Comp. 17 | Comp. 18 | Comp. 19 | Comp. 20 |
|---|---|---|---|---|---|---|---|---|---|---|
| Diamond Powder | Particle Diameter: 0.3 μm | 60 pts. mass | — | — | — | — | — | — | Blend | — |
|  |  | 150 pts. mass | — | — | — | — | — | — | — | Blend |
|  | LED Solder Alloy Formation |  | F | F | F | F | F | F | F | F |
|  | Thermal Resistance (K/W) |  | 22 | 19 | 28 | 27 | 41 | 38 | 21 | 22 |
| Adhesive Strength to Aluminum | Die Shear Strength |  | 8.1N | 5.9N | 7.9N | 6.0N | 8.12N | 6.2N | 8.3N | 8.1N |
|  | Overall Evaluation |  | NG | | | | | | | |

In Comparative Example 1, because solder particles were not blended, metal bonding due to melted solder was not generated and thermal resistance became excessively high so that heat-dissipation properties were poor.

Furthermore, in Comparative Examples 2 and 3, because an excessive amount of the solder particles was blended, although melted solder formed, adhesive strength between the aluminum wiring board and the anisotropic conductive adhesive agent was degraded and adhesive strength between the anisotropic conductive adhesive agent and the LED element was degraded.

Still further, in Comparative Examples 4, 5 and 6, a melting point of 200° C. for the solder particles led to insufficient solder melting during the compression-bonding step such that metal bonding due to melted solder was not generated, which degraded adhesive strength between the anisotropic conductive adhesive agent and the LED element and led to excessively high thermal resistance such that heat-dissipation properties were poor.

Moreover, in Comparative Examples 7, 8, 9, 10, 11 and 12, use of aluminum oxide powder as a heat-dissipating material led to metal bonding due to melted solder not being generated which degraded adhesive strength between the anisotropic conductive adhesive agent and the LED element and led to excessively high thermal resistance such that heat-dissipation properties were poor. Although thermal conductivity of the aluminum oxide powder was 40 W/mK, in contrast to the present examples, desired properties were unobtainable by the adhesive agent containing aluminum oxide powder instead of the solder particles.

Furthermore, in Comparative Examples 13 and 14, use of aluminum nitride powder as a heat-dissipating material led to metal bonding due to melted solder not being generated, which degraded adhesive strength between the anisotropic conductive adhesive agent and the LED element and led to excessively high thermal resistance such that heat-dissipation properties were poor. Although thermal conductivity of the aluminum nitride powder was 180 W/mK, in contrast to the present examples, desired properties were unobtainable by the adhesive agent containing aluminum nitride powder instead of the solder particles.

Figure 7:
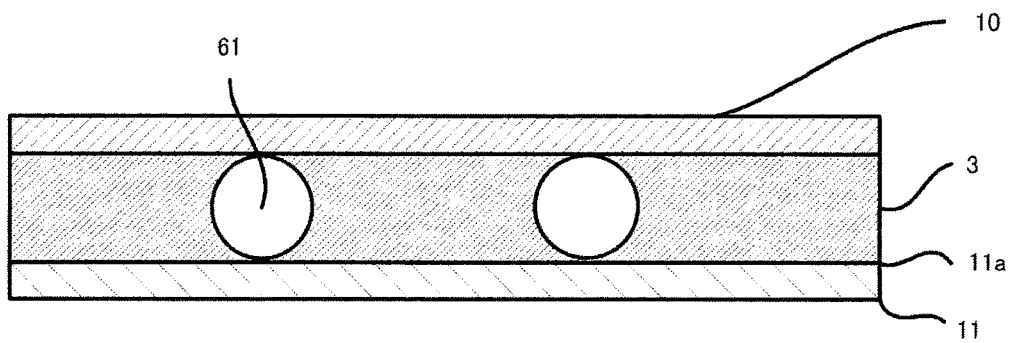
FIG. 7 is a view illustrating a case in which diamond particles are used as a material for heat dissipation.

Here, the case of adding aluminum nitride as a heat-dissipating material will be considered. As illustrated in FIG. 7, in the case of adding aluminum nitride particles 61 into the binder resin 3, because aluminum nitride particles 61 do not melt easily such as in the solder particles, the particle shapes thereof are maintained and make point contact with the electrodes 10. Accordingly, surface area for transferring heat away from the LED element is extremely small and heat-dissipation properties are poor in comparison to the case of using solder particles. Furthermore, contact between the aluminum nitride particles 61 and the wiring 11 is also point contact. Accordingly, heat-dissipation properties from the aluminum nitride particles 61 towards the wiring board side are also poor.

Still further, in Comparative Examples 15 and 16, use of Ni powder as a heat-dissipating material led to metal bonding due to melted solder not being generated, which degraded adhesive strength between the anisotropic conductive adhesive agent and the LED element and led to excessively high thermal resistance such that heat-dissipation properties were poor. Although thermal conductivity of the Ni powder was 95 W/mK, in contrast to the present examples, desired properties were unobtainable by the adhesive agent containing Ni powder instead of the solder particles.

Yet further, in Comparative Examples 17 and 18, use of Cu powder as a heat-dissipating material led to metal bonding due to melted solder not being generated, which degraded adhesive strength between the anisotropic conductive adhesive agent and the LED element and led to excessively high thermal resistance such that heat-dissipation properties were poor. Although thermal conductivity of the Cu powder was 400 W/mK, in contrast to the present examples, desired properties were unobtainable by the adhesive agent containing Cu powder instead of the solder particles.

Figure 8:
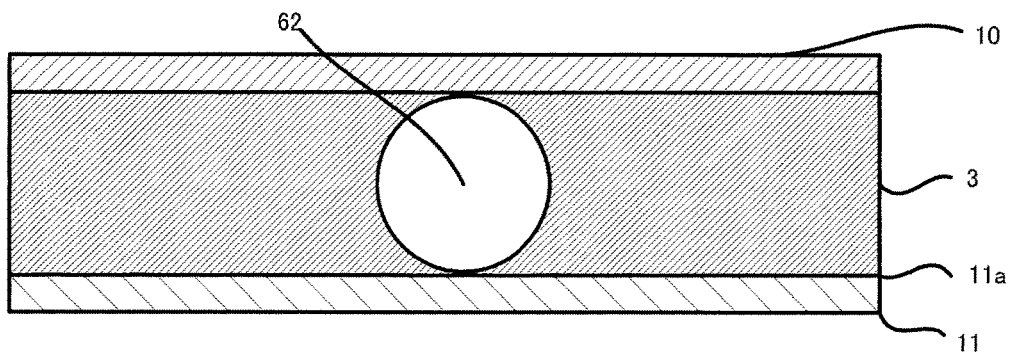
FIG. 8 is a view illustrating a case in which a copper powder is used as a material for heat dissipation.

Here, the case of adding Cu particles as a heat-dissipating material will be considered. As illustrated in FIG. 8, in the case of adding Cu particles 62 into the binder resin 3, because the Cu particles 62 do not melt easily compared to the solder particles, the particle shapes thereof are maintained and make point contact with the electrodes 10 as in the case of the aluminum nitride particles 61. Moreover, because the Cu particles 62 have a very large particle diameter, thickness of the adhesive agent is increased. Even when using Cu particles having high thermal conductivity, thickness of the adhesive agent layer impairs heat-dissipation for the entire adhesive agent layer and desired heat-dissipation properties are unobtainable.

Yet still further, in Comparative Examples 19 and 20, use of a diamond powder as a heat-dissipating material led to metal bonding due to melted solder not being generated, which degraded adhesive strength between the anisotropic conductive adhesive agent and the LED element and led to excessively high thermal resistance such that heat-dissipation properties were poor. Although thermal conductivity of the diamond powder was 1,500 W/mK, in contrast to the present examples, desired properties were unobtainable by the adhesive agent containing diamond powder instead of the solder particles.

Figure 9:
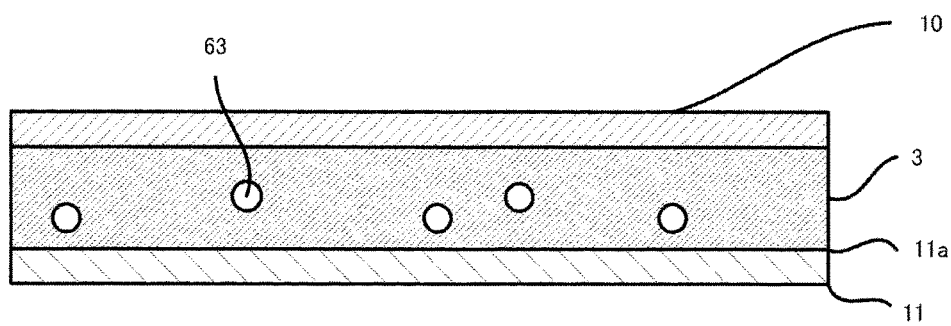
FIG. 9 is a view in which an aluminum nitride powder is used as a material for heat dissipation.

Here, the case of adding diamond particles as a heat-dissipating material will be considered. As illustrated in FIG. 9 in the case of adding diamond particles 63 into the binder resin 3, because the diamond particles 63 are small in comparison to the thickness of the adhesive agent layer, contact with the electrode portions of the LED element and substrate-side wiring is not possible. Thus, because a path for transferring heat from the LED element to the wiring board side is not formed, even in the case of using diamond particles having a high thermal conductivity, desired heat-dissipation properties are unobtainable.

In contrast, in the Examples 1 to 6, because an alicyclic epoxy compound, a latent cationic curing agent, and an acrylic resin having acrylic acid (AA) and 2-hydroxyethyl methacrylate (HEMA) were blended, in addition to properties suited for optical application, with respect to aluminum wiring having an oxide film, high adhesive strength and excellent conduction reliability were obtained; furthermore, because the melting point of the solder particles was not higher than the temperature for mounting, the solder particles melted and metal bonded with the electrodes of the LED element in the compression-bonding step so that high adhesive strength and excellent heat-dissipation properties were obtained.

Figure 10:
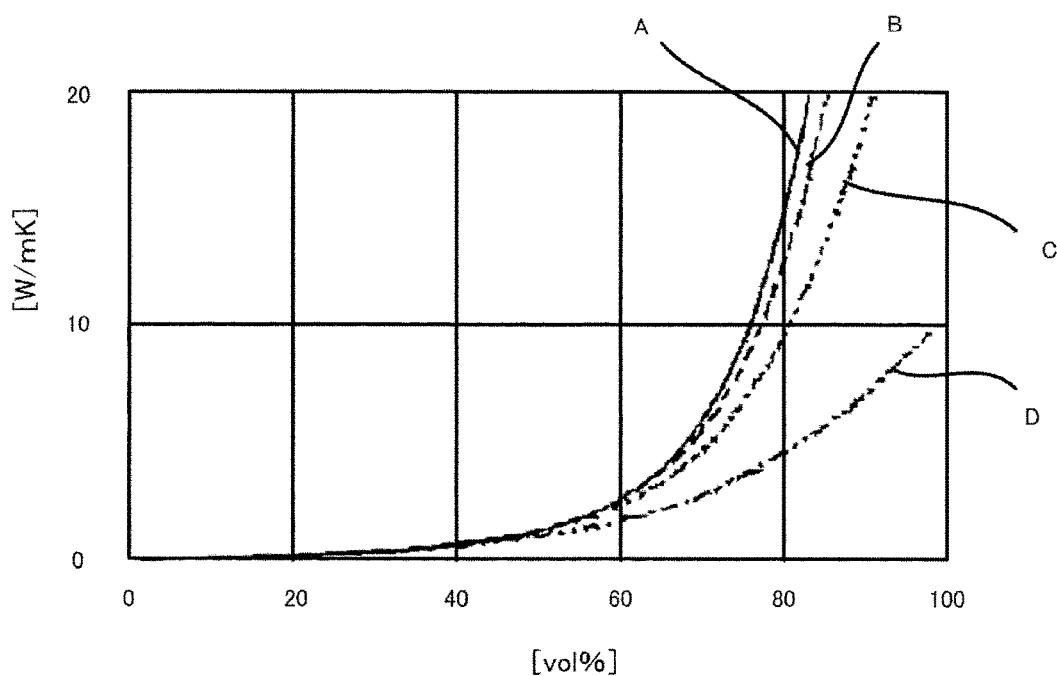
FIG. 10 is a view representing heat-dissipation properties of a resin binder.

It should be noted that resin binder heat-dissipation properties are expressed in FIG. 10 for reference. Prepared resin examples include a resin A having a thermal conductivity of 10 W/mK, a resin B having a thermal conductivity of 30 W/mK, a resin C having a thermal conductivity of 50 W/mK and a resin D having a thermal conductivity of 70 W/mK. In general, it can be understood that, if the volume fraction (vol %) of heat-dissipating resin in the adhesive agent layer is not high, heat-dissipating properties are unobtainable. Because thermal resistance is defined as layer thickness/(adhesion area*thermal conductivity), and an excessively high layer thickness leads to high thermal resistance, it can be understood that a large particle diameter of the heat-dissipating material would increase layer thickness and thus be unfavorable.

Second Examples

Next, a second set of examples according to the present disclosure will be described. In these examples, each variety of anisotropic conductive adhesive agent was manufactured, LED mounting samples were manufactured in which LED elements were mounted onto substrates using these anisotropic conductive adhesive agents, and adhesive strength and electrical resistance were evaluated. It should be noted that the present disclosure is not limited to these examples.

Peel Strength Measurement

Anisotropic conductive adhesive agent was applied at a thickness of 100 μm onto a white plate comprising ceramic to which a 1.5×10 mm aluminum piece was thermocompression bonded under conditions of 180° C., 1.5 N and 30 sec to manufacture bonded structures.

As illustrated in FIG. 4, using a TENSILON, the aluminum pieces of the bonded structures were peeled at a peel speed of 50 mm/sec in the 90° y-axis direction, and the maximum peel strength required to peel was measured.

LED Mounting Sample Manufacturing

As illustrated in FIG. 5, LED mounting samples were manufactured. A plurality of wiring boards 51 having a 50 μm pitch (50 μm Al wiring, 25 μm PI (polyimide) layer, 50 μm Al base) were arranged onto a stage, and 10 μg of anisotropic conductive adhesive agent 50 was applied to each of the wiring boards 51. Onto an anisotropic conductive adhesive agent 50, LED chips 52 manufactured by Cree, Inc. (trade name: DA3547, maximum rating: 150 mA, size: 0.35×0.46 mm) were mounted, a thermocompression tool 53 was used in flip-chip mounting to obtain LED mounting samples.

Die Shear Strength Measurement

As illustrated in FIG. 6, bonding strength of each of the LED mounting samples was measured by using a die shear strength tester under conditions of 25° C. and a shearing velocity of 20 μm/sec for a tool 54.

Pre-Bending Test Electrical Resistance Evaluation

For each LED mounting body sample, initial and post-thermal cycle test (TCT) electrical resistances were measured. In the thermal cycle test, the LED mounting samples were exposed to −40° C. and 100° C. atmospheres for 30 minutes each to complete one cycle; 1,000 thermal cycles were performed, and electrical resistances were measured. In evaluation of electrical resistance, the Vf value was measured when If=50 mA, a less than 5% rise in Vf value from the initially recorded Vf value was evaluated as "good" (hereinafter referred to as "G") and 5% or more was evaluated as "fail" (hereinafter referred to as "F.")

Post-Bending Test Electrical Resistance Evaluation

Figure 11:
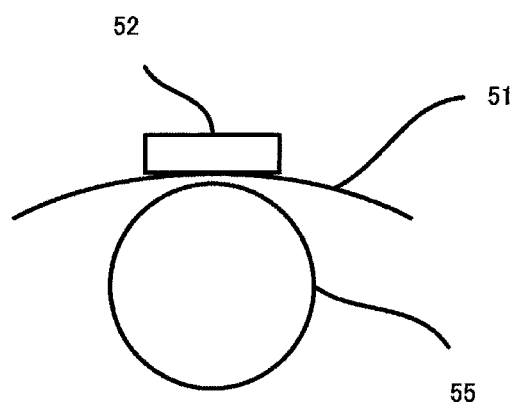
FIG. 11 is a view illustrating a bending test.
Figure 12:
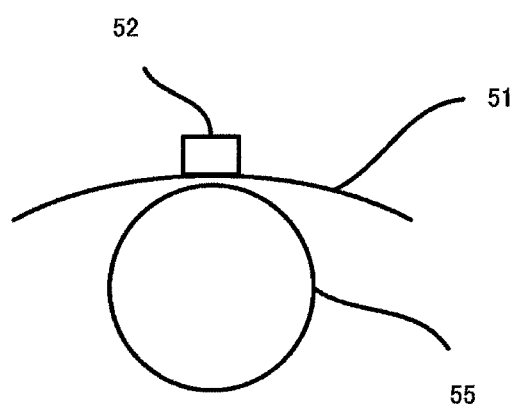
FIG. 12 is a view illustrating a bending test.

As illustrated in FIGS. 11 and 12, a test was performed in which each of the LED mounting samples were bent by pressing a side surface of a cylindrical test roller 55 thereagainst before measuring electrical resistance. In particular, in the LED chip 52, being approximately rectangular, as illustrated in FIG. 11, a test in which the wiring board 51 was bent so as to be rounded in the longitudinal direction (x-axis direction) of the LED chip 52 and, as illustrated in FIG. 12, a test in which the wiring board 51 was bent so as to be rounded in the transverse direction (y-axis direction) of the LED chip 52 were each performed once.

Furthermore, because a smaller radius (R) of the test roller 55 corresponds to higher bending stress in each of the LED mounting samples, a plurality of radii were employed in each of the tests. In particular, the tests were performed by bending using test rollers 55 having a diameter of 20 mm (R=10 mm), a diameter of 10 mm (R=5 mm) and a diameter of 6 mm (R=3 mm); electrical resistances for each were then measured. In evaluation of electrical resistance, the Vf value was measured when If=50 mA, a less than 5% rise in Vf value from the initially recorded Vf value was evaluated as "G" and 5% or more was evaluated as "F."

Herein, in the case of low adhesive strength between the anisotropic conductive adhesive agent and the wiring board, conduction properties are lost after the bending test, thus increasing the electrical resistance value. In the case low adhesive strength, this is due to there being cases in which an intercomponent distance is opened between the electrodes and the wiring by the bending test such that contact with the conductive particles is lost.

Overall Evaluation

Samples evaluated as "G" for initial and post-thermal cycle test electrical resistance in addition to having a peel strength of 2.0 N or more and a die sheer strength of 5.0 N or more and being evaluated as "G" for all post-bending test conduction evaluation were evaluated as "OK" and otherwise evaluated as "NG."

Example 7

As a binder A, into an adhesive agent comprising 100 pts. mass of alicyclic epoxy compound (product name: CEL-LOXIDE 2021P, manufacturer: DAICEL CORPORATION), 5 pts. mass latent cationic curing agent (aluminum chelate-type latent curing agent) and 3 pts. mass of acrylic resin (15 wt % butyl acrylate (BA), 63 wt % ethyl acrylate (EA), 20 wt % acrylonitrile (AN), 1 wt % acrylic acid (AA) and 1 wt % 2-hydroxyethyl methacrylate (HEMA), weight-average molecular weight: 700,000), 30 pts. mass solder particles having a solder melting point of 150° C. and 10 pts.

mass conductive particles (product name: AUL 704, manufacturer: SEKISUI CHEMICAL CO., LTD.) were dispersed to manufacture an anisotropic conductive adhesive agent. Furthermore, curing conditions in manufacturing LED mounting samples were 180° C., 1.5 N and 30 sec.

It should be noted that solder particles used in each of the examples had an average particle diameter of 5 µm, 7 µm, 10 µm, 12 µm and 25 µm. Because no significant difference was found between particle diameters in the above-described range, results for individual particle diameters have been omitted; however, the results of the present examples can be obtained by using particle diameters that are at least within the above-described range. This is also the same in the following examples and comparative examples in which solder particles are blended.

Each evaluation result for Example 7 is represented in Table 4. Initial peel strength was 4.0 N. Furthermore, initial die sheer strength of the LED mounting samples was 8.5 N. Moreover, for the LED mounting samples, before the bending test, initial conduction was evaluated as G, after 1,000 cycles of the thermal cycle test, conduction was evaluated as G; evaluation after the bending test resulted in G for the 20 mm, G for the 10 mm and G for the 6 mm diameter test rollers. Accordingly, overall evaluation was OK.

Example 8

Other than that solder particles having a melting point of 150° C. were blended at 80 pts. mass, an anisotropic conductive adhesive agent was manufactured as in Example 7.

Each evaluation result for Example 8 is represented in Table 4.

Initial peel strength was 4.0 N. Furthermore, initial die sheer strength of the LED mounting samples was 8.5 N. Moreover, for the LED mounting samples, before the bending test, initial conduction was evaluated as G, after 1,000 cycles of the thermal cycle test, conduction was evaluated as G; evaluation after the bending test resulted in G for the 20 mm, G for the 10 mm and G for the 6 mm diameter test roller. Accordingly, overall evaluation was OK.

Example 9

Other than that solder particles having a melting point of 170° C. were blended at 30 pts. mass, an anisotropic conductive adhesive agent was manufactured as in Example 7.

Each evaluation result for Example 9 is represented in Table 4. Initial peel strength was 4.0 N. Furthermore, initial die sheer strength of the LED mounting samples was 8.5 N. Moreover, for the LED mounting samples, before the bending test, initial conduction was evaluated as G, after 1,000 cycles of the thermal cycle test, conduction was evaluated as G; evaluation after the bending test resulted in G for the 20 mm, G for the 10 mm and G for the 6 mm diameter test rollers. Accordingly, overall evaluation was OK.

Example 10

Other than that solder particles having a melting point of 170° C. were blended at 80 pts. mass, an anisotropic conductive adhesive agent was manufactured as in Example 7.

Each evaluation result for Example 10 is represented in Table 4. Initial peel strength was 4.0 N. Furthermore, initial die sheer strength of the LED mounting samples was 8.5 N. Moreover, for the LED mounting samples, before the bending test, initial conduction was evaluated as G, after 1,000 cycles of the thermal cycle test, conduction was evaluated as G; evaluation after the bending test resulted in G for the 20 mm, G for the 10 mm and G for the 6 mm diameter test rollers. Accordingly, overall evaluation was OK.

Comparative Example 21

Other than that solder particles were not blended, an anisotropic conductive adhesive agent was manufactured as in Example 7.

Each evaluation result for Comparative Example 21 is represented in Table 4. Initial peel strength was 4.0 N. Furthermore, initial die sheer strength of the LED mounting samples was 8.5 N. Moreover, for the LED mounting samples, before the bending test, initial conduction was evaluated as G, after 1,000 cycles of the thermal cycle test, conduction was evaluated as G; evaluation after the bending test resulted in G for the 20 mm, F for the 10 mm and F for the 6 mm diameter test rollers. Accordingly, overall evaluation was NG.

Comparative Example 22

Other than that solder particles having a melting point of 150° C. were blended at 160 pts. mass, an anisotropic conductive adhesive agent was manufactured as in Example 7.

Each evaluation result for Comparative Example 22 is represented in Table 4. Initial peel strength was 1.2 N. Furthermore, initial die sheer strength of the LED mounting samples was 2.0 N. Moreover, for the LED mounting samples, before the bending test, initial conduction was evaluated as G, after 1,000 cycles of the thermal cycle test, conduction was evaluated as F; evaluation after the bending test resulted in F for the 20 mm, F for the 10 mm and F for the 6 mm diameter test rollers. Accordingly, overall evaluation was NG.

Comparative Example 23

Other than that solder particles having a melting point of 170° C. were blended at 160 pts. mass, an anisotropic conductive adhesive agent was manufactured as in Example 7.

Each evaluation result for Comparative Example 23 is represented in Table 4. Initial peel strength was 1.2 N. Furthermore, initial die sheer strength of the LED mounting samples was 2.0 N. Moreover, for the LED mounting samples, before the bending test, initial conduction was evaluated as G, after 1,000 cycles of the thermal cycle test, conduction was evaluated as F; evaluation after the bending test resulted in F for the 20 mm, F for the 10 mm and F for the 6 mm diameter test rollers. Accordingly, overall evaluation was NG.

Comparative Example 24

Other than that solder particles having a melting point of 200° C. were blended at 30 pts. mass, an anisotropic conductive adhesive agent was manufactured as in Example 7.

Each evaluation result for Comparative Example 24 is represented in Table 4. Initial peel strength was 4.0 N. Furthermore, initial die sheer strength of the LED mounting samples was 8.5 N. Moreover, for the LED mounting samples, before the bending test, initial conduction was evaluated as G, after 1,000 cycles of the thermal cycle test, conduction was evaluated as F; evaluation after the bending test resulted in F for the 20 mm, F for the 10 mm and F for the 6 mm diameter test rollers. Accordingly, overall evaluation was NG.

Comparative Example 25

Other than that solder particles having a melting point of 200° C. were blended at 80 pts. mass, an anisotropic conductive adhesive agent was manufactured as in Example 7.

Each evaluation result for Comparative Example 25 is represented in Table 4. Initial peel strength was 4.0 N. Furthermore, initial die sheer strength of the LED mounting samples was 8.5 N. Moreover, for the LED mounting samples, before the bending test, initial conduction was evaluated as G, after 1,000 cycles of the thermal cycle test, conduction was evaluated as F; evaluation after the bending test resulted in F for the 20 mm, F for the 10 mm and F for the 6 mm diameter test rollers. Accordingly, overall evaluation was NG.

Comparative Example 26

Other than that solder particles having a melting point of 200° C. were blended at 160 pts. mass, an anisotropic conductive adhesive agent was manufactured as in Example 7.

Each evaluation result for Comparative Example 26 is represented in Table 4. Initial peel strength was 1.2 N. Furthermore, initial die sheer strength of the LED mounting samples was 2.0 N. Moreover, for the LED mounting samples, before the bending test, initial conduction was evaluated as G, after 1,000 cycles of the thermal cycle test, conduction was evaluated as G; evaluation after the bending test resulted in G for the 20 mm, F for the 10 mm and F for the 6 mm diameter test rollers. Accordingly, overall evaluation was NG.

Comparative Example 27

As a binder B, into an adhesive agent comprising 50 pts. mass of alicyclic epoxy compound (product name: CEL-LOXIDE 2021P, manufacturer: DAICEL CORPORATION), 40 pts. mass of acid anhydride curing agent (methylhexahydrophthalic anhydride), 3 pts. mass acrylic resin (BA: 15 wt %, EA: 63 wt %, AN: 20 wt % AA: 1 wt % and HEMA: 1 wt %, Mw: 200,000), 10 pts. mass of conductive particles (product name: AUL 704, manufacturer: SEKISUI CHEMICAL CO., LTD.) were dispersed to manufacture an anisotropic conductive adhesive agent. Solder particles were not added. Furthermore, curing conditions in manufacturing LED mounting samples were 230° C., 1.5 N and 30 sec.

Each evaluation result for Comparative Example 27 is represented in Table 5. Initial peel strength was less than 0.5 N. Furthermore, initial die sheer strength of the LED mounting samples was 3.8 N. Moreover, for the LED mounting samples, before the bending test, initial conduction was evaluated as G, after 1,000 cycles of the thermal cycle test, conduction was evaluated as F; evaluation after the bending test resulted in F for the 20 mm, F for the 10 mm and F for the 6 mm diameter test rollers. Accordingly, overall evaluation was NG.

Comparative Example 28

Other than that solder particles having a melting point of 170° C. were blended at 80 pts. mass, an anisotropic conductive adhesive agent was manufactured as in Example 27.

Each evaluation result for Comparative Example 28 is represented in Table 5. Initial peel strength was less than 0.5 N. Furthermore, initial die sheer strength of the LED mounting samples was 3.8 N. Moreover, for the LED mounting samples, before the bending test, initial conduction was evaluated as G, after 1,000 cycles of the thermal cycle test, conduction was evaluated as F; evaluation after the bending test resulted in F for the 20 mm, F for the 10 mm and F for the 6 mm diameter test rollers. Accordingly, overall evaluation was NG.

Comparative Example 29

As a binder C, other than that 100 pts. mass of cycloolefin was used instead of the alicyclic epoxy compound, an anisotropic conductive adhesive agent was manufactured as in Example 7. Solder particles were not added. Furthermore, curing conditions in manufacturing LED mounting samples were 180° C., 1.5 N, and 240 sec.

Each evaluation result for Comparative Example 29 is represented in Table 5. Initial peel strength was 1.4 N. Furthermore, initial die sheer strength of the LED mounting samples was 7.2 N. Moreover, for the LED mounting samples, before the bending test, initial conduction was evaluated as G, after 1,000 cycles of the thermal cycle test, conduction was evaluated as F; evaluation after the bending test resulted in F for the 20 mm, F for the 10 mm and F for the 6 mm diameter test rollers. Accordingly, overall evaluation was NG.

Comparative Example 30

Other than that solder particles having a melting point of 170° C. were blended at 80 pts. mass, an anisotropic conductive adhesive agent was manufactured as in Example 29.

Each evaluation result for Comparative Example 30 is represented in Table 5. Initial peel strength was 1.4 N. Furthermore, initial die sheer strength of the LED mounting samples was 7.2 N. Moreover, for the LED mounting samples, before the bending test, initial conduction was evaluated as G, after 1,000 cycles of the thermal cycle test, conduction was evaluated as F; evaluation after the bending test resulted in F for the 20 mm, F for the 10 mm and F for the 6 mm diameter test rollers. Accordingly, overall evaluation was NG.

Comparative Example 31

As a binder D, other than that a bisphenol F type epoxy compound was used instead of the alicyclic epoxy compound, an anion curing agent (amine curing agent) was used instead of the latent cationic curing agent, and the acrylic resin was not blended, an anisotropic conductive adhesive agent was manufactured as in Example 7. Solder particles were not added. Furthermore, curing conditions in manufacturing LED mounting samples were 150° C., 1.5 N and 30 sec.

Each evaluation result for Comparative Example 31 is represented in Table 5. Initial peel strength was 2.5 N. Furthermore, initial die sheer strength of the LED mounting samples was 7.1 N. Moreover, for the LED mounting samples, before the bending test, initial conduction was evaluated as G, after 1,000 cycles of the thermal cycle test, conduction was evaluated as F; evaluation after the bending test resulted in G for the 20 mm, F for the 10 mm and F for the 6 mm diameter test rollers. Accordingly, overall evaluation was NG.

Comparative Example 32

Other than that solder particles having a melting point of 170° C. were blended at 80 pts. mass, an anisotropic conductive adhesive agent was manufactured as in Example 31.

Each evaluation result for Comparative Example 32 is represented in Table 5. Initial peel strength was 2.5 N. Furthermore, initial die sheer strength of the LED mounting samples was 7.1 N. Moreover, for the LED mounting samples, before the bending test, initial conduction was evaluated as G, after 1,000 cycles of the thermal cycle test, conduction was evaluated as F; evaluation after the bending test resulted in G for the 20 mm, F for the 10 mm and F for the 6 mm diameter test rollers. Accordingly, overall evaluation was NG.

TABLE 4

| | | | EX. 7 | EX. 8 | EX. 9 | EX. 10 | Comp. 21 | Comp. 22 | Comp. 23 | Comp. 24 | Comp. 25 | Comp. 26 |
|---|---|---|---|---|---|---|---|---|---|---|---|---|
| | Binder | | | | | | | A | | | | |
| Solder Melting Point 150° C. | Particle Diameter: 5 to 25 μm | 30 pts. mass 80 pts. mass 160 pts. mass | Blend — — | — Blend — | — — — | — — — | — — — | — — Blend | — — — | — — — | — — — | — — — |
| Solder Melting Point 170° C. | Particle Diameter: 5 to 25 μm | 30 pts. mass 80 pts. mass 160 pts. mass | — — — | — — — | Blend — — | — Blend — | — — — | — — — | — — Blend | — — — | — — — | — — — |
| Solder Melting Point 200° C. | Particle Diameter: 5 to 25 μm | 30 pts. mass 80 pts. mass 160 pts. mass | — — — | — — — | — — — | — — — | — — — | — — — | — — — | Blend — — | — Blend — | — — Blend |
| Conduction Evaluation 50 mA | Mounting Initial TCT (1,000 Cycles) | | G G | G G | G G | G G | G G | G F | G F | G F | G F | G G |
| Bending Test Conduction Evaluation 50 mA | 20 mm Diameter (R = 10) 10 mm Diameter (R = 5) 6 mm Diameter (R = 3) | | G G G | G G G | G G G | G G G | G F F | F F F | F F F | F F F | F F F | G F F |
| Adhesive Strength to Aluminum | Die Shear Strength 90 Degree Peel Strength | | | 8.5N 4.5N | | 8.5N 4.0N | | 2.0N 1.2N | | | 8.5N 4.0N | 2.0N 1.2N |
| | Overall Evaluation (Conduction & Adhesive/Mechanical Strength) | | | OK | | | | NG | | | | |

TABLE 5

| | | | Comp. 27 | Comp. 28 | Comp. 29 | Comp. 30 | Comp. 31 | Comp. 32 |
|---|---|---|---|---|---|---|---|---|
| | Binder | | B | | C | | D | |
| Solder Melting Point 150° C. | Particle Diameter: 5 to 25 μm | 30 pts. mass 80 pts. mass 160 pts. mass | — — — | — — — | — — — | — — — | — — — | — — — |
| Solder Melting Point 170° C. | Particle Diameter: 5 to 25 μm | 30 pts. mass 80 pts. mass 160 pts. mass | — — — | — Blend — | — — — | — Blend — | — — — | — Blend — |
| Solder Melting Point 200° C. | Particle Diameter: 5 to 25 μm | 30 pts. mass 80 pts. mass 160 pts. mass | — — — | — — — | — — — | — — — | — — — | — — — |
| Conduction Evaluation 50 mA | Mounting Initial TCT (1,000 Cycles) | | G F | G F | G F | G F | G F | G F |
| Bending Test Conduction Evaluation 50 mA | 20 mm Diameter (R = 10) 10 mm Diameter (R = 5) 6 mm Diameter (R = 3) | | F F F | F F F | F F F | F F F | G F F | G F F |
| Adhesive Strength to Aluminum | Die Shear Strength 90 Degree Peel Strength | | | 3.8N <0.5N | | 7.2N 1.4N | | 7.1N 2.5N |
| | Overall Evaluation (Conduction & Adhesive/Mechanical Strength) | | | | | NG | | |

In Comparative Example 21, due to not blending the solder particles, melted solder formation did not occur leading to the anchor effect being unobtainable, thereby degrading adhesive strength between the anisotropic conductive adhesive agent and the LED element so that in bending testing using test rollers having a diameter of 10 mm or less, conduction reliability was low.

Still Further, in Comparative Examples 22 and 23, because an excessive amount of the solder particles was blended, although melted solder formation occurred, adhesive strength between the aluminum wiring board and the anisotropic conductive adhesive agent was degraded and adhesive strength between the anisotropic conductive adhesive agent and the LED element was degraded so that conduction reliability was low in the bending test.

Yet further, in Comparative Examples 24, 25 and 26, because the solder particles had a melting point of 200° C., melting of the solder during the compression-bonding step was insufficient so that metal bonding due to melted solder was not generated, thereby degrading adhesive strength between the anisotropic conductive adhesive agent and the LED element; thus, conduction reliability was low after the TCT test and after the bending test.

Moreover, in Comparative Examples 27 and 28, by using an acid anhydride as the curing agent in the binder B, regardless of the presence or absence of the solder particles, conduction reliability was low after the TCT test and after the bending test. Accordingly, it was revealed that the combination of the binder A and the solder particles was effective.

Furthermore, in Comparative Examples 29 and 30, by using a cycloolefin as a main agent in the binder C, regardless of the presence or absence of the solder particles, conduction reliability was low after the TCT test and after the bending test. Accordingly, it was revealed that the combination of the binder A and the solder particles was effective.

Still further, in Comparative Examples 31 and 32, in the binder D, although the amine curing agent had adhesive strength with respect to aluminum due to a polar effect, samples did not withstand conduction evaluation in the bending test with test rollers having diameters of 10 mm or less such that conduction reliability was low. Accordingly, it was revealed that the combination of the binder A and the solder particles was effective.

In contrast, in the Examples 7 to 10, because an alicyclic epoxy compound, a latent cationic curing agent, and an acrylic resin having acrylic acid (AA) and 2-hydroxyethyl methacrylate (HEMA) were blended, in addition to properties suited for optical application, with respect to aluminum wiring having an oxide film, high adhesive strength and excellent conduction reliability were obtained; furthermore, because the melting point of the solder particles was not higher than the temperature for mounting, the solder particles melted and metal bonded with the electrodes of the LED element in the compression-bonding step so that high adhesive strength and excellent heat-dissipation properties were obtained after the TCT test and after the bending test.

REFERENCE SIGNS LIST

1 solder particles, 1a melted solder, 1b end surface (metal bonding surface), 2 conductive particles, 3 resin binder, 10 electrodes, 11 wiring, 11a oxide film, 12 sea of epoxy compound, 13 island of acrylic resin, 21 substrate, 22 wiring pattern, 23 light-emitting element, 24 n-electrode, 25 p-electrode, 26 bump, 30 anisotropic conductive film, 50 anisotropic conductive adhesive agent, 51 wiring board, 52 LED chip, 53 thermocompression tool, 54 tool, 55 test roller, 61 aluminum nitride particles, 62 Cu particles, 63 diamond particles

The invention claimed is:

1. An adhesive agent for bonding a heat-generating electronic component and a substrate comprising:
   an alicyclic epoxy compound or a hydrogenated epoxy compound, a cationic catalyst, an acrylic resin having a weight-average molecular weight of 50,000 to 900,000 and solder particles,
   wherein the acrylic resin contains an acrylic acid at 0.5 to 10 wt % and an acrylic acid ester having a hydroxyl group at 0.5 to 10 wt %, and
   the acrylic resin is contained at 1 to 5 pts. mass with respect to 100 pts. mass of the epoxy compound.

2. The adhesive agent according to claim 1, wherein the solder particles are blended at an amount of 30 or more to less than 150 pts. mass with respect to 100 pts. mass of the epoxy compound.

3. The adhesive agent according to claim 2, wherein the solder particles have an average particle diameter of 3 or more to less than 30 μm.

4. The adhesive agent according to claim 2, wherein the acrylic acid ester having a hydroxyl group is one or more substances selected from the group consisting of 2-hydroxyethyl methacrylate, 2-hydroxypropyl methacrylate, 2-hydroxyethyl acrylate and 2-hydroxypropyl acrylate.

5. The adhesive agent according to claim 2, wherein the acrylic resin contains butyl acrylate, ethyl acrylate and acrylonitrile.

6. The adhesive agent according to claim 2, wherein the cationic catalyst is an aluminum chelate-type latent curing agent.

7. The adhesive agent according to claim 2, further comprising conductive particles.

8. The adhesive agent according to claim 1, wherein the solder particles have an average particle diameter of 3 or more to less than 30 μm.

9. The adhesive agent according to claim 1, wherein the acrylic acid ester having a hydroxyl group is one or more substances selected from the group consisting of 2-hydroxyethyl methacrylate, 2-hydroxypropyl methacrylate, 2-hydroxyethyl acrylate and 2-hydroxypropyl acrylate.

10. The adhesive agent according to claim 1, wherein the acrylic resin contains butyl acrylate, ethyl acrylate and acrylonitrile.

11. The adhesive agent according to claim 1, wherein the cationic catalyst is an aluminum chelate-type latent curing agent.

12. The adhesive agent according to claim 1, further comprising conductive particles.

13. The adhesive agent according to claim 1, wherein the solder particles are blended at an amount of 50 or more to less than 150 pts. mass with respect to 100 pts. mass of the epoxy compound.

14. A connection structure comprising:
   a substrate having a wiring pattern;
   an anisotropic conductive film formed on electrodes of the wiring pattern; and
   a heat-generating electronic component mounted on the anisotropic conductive film;
   wherein the anisotropic conductive film contains an epoxy compound, a resin binder and solder particles, and the solder particles are metal-bonded to terminal portions of the electronic component, the resin binder contains an acrylic resin having a weight-average molecular weight of 50,000 to 900,000, acrylic resin contains an acrylic acid at 0.5 to 10 wt % and an acrylic acid ester having a hydroxyl group at 0.5 to 10 wt %, and the acrylic resin is contained at 1 to 5 pts. mass with respect to 100 pts. mass of the epoxy compound.

15. An adhesive agent comprising:

an epoxy compound, a cationic catalyst, an acrylic resin having a weight-average molecular weight of 50,000 to 900,000 and solder particles;

wherein the acrylic resin contains an acrylic acid at 0.5 to 10 wt % and an acrylic acid ester having a hydroxyl group at 0.5 to 10 wt %, and wherein the acrylic resin is contained at 1 to 5 pts. mass with respect to 100 pts. mass of the epoxy compound.

16. The adhesive agent according to claim 15, wherein the solder particles have a blending amount of 30 or more to less than 150 pts. mass with respect to 100 pts. mass of the epoxy compound.

17. The adhesive agent according to claim 16, wherein the acrylic acid ester having a hydroxyl group is one or more substances selected from the group consisting of 2-hydroxyethyl methacrylate, 2-hydroxypropyl methacrylate, 2-hydroxyethyl acrylate and 2-hydroxypropyl acrylate.

18. The adhesive agent according to claim 16, wherein the acrylic resin contains butyl acrylate, ethyl acrylate and acrylonitrile.

19. The adhesive agent according to claim 16, wherein the cationic catalyst is an aluminum chelate-type latent curing agent.

20. The adhesive agent according to claim 16, further comprising conductive particles.

21. The adhesive agent according to claim 15, wherein the solder particles have an average particle diameter of 3 or more to less than 30 μm.

22. The adhesive agent according to claim 21, wherein the acrylic acid ester having a hydroxyl group is one or more substances selected from the group consisting of 2-hydroxyethyl methacrylate, 2-hydroxypropyl methacrylate, 2-hydroxyethyl acrylate and 2-hydroxypropyl acrylate.

23. The adhesive agent according to claim 21, wherein the acrylic resin contains butyl acrylate, ethyl acrylate and acrylonitrile.

24. The adhesive agent according to claim 21, wherein the cationic catalyst is an aluminum chelate-type latent curing agent.

25. The adhesive agent according to claim 21, further comprising conductive particles.

26. The adhesive agent according to claim 15, wherein the acrylic acid ester having a hydroxyl group is one or more substances selected from the group consisting of 2-hydroxyethyl methacrylate, 2-hydroxypropyl methacrylate, 2-hydroxyethyl acrylate and 2-hydroxypropyl acrylate.

27. The adhesive agent according to claim 15, wherein the acrylic resin contains butyl acrylate, ethyl acrylate and acrylonitrile.

28. The adhesive agent according to claim 15, wherein the cationic catalyst is an aluminum chelate-type latent curing agent.

29. The adhesive agent according to claim 15, further comprising conductive particles.

30. The adhesive agent according to claim 29, wherein the solder particles have an average particle diameter which is more than an average particle diameter of the conductive particles.

31. The adhesive agent according to claim 15, wherein the solder particles have a melting point of 180° C. or less.

32. A connection structure comprising:

a substrate having a wiring pattern which has an oxide formed on a surface thereof;

an anisotropic conductive film formed on electrodes of the wiring pattern; and an electronic component mounted on the anisotropic conductive film;

wherein the anisotropic conductive film is a cured product of an anisotropic conductive adhesive containing an epoxy compound, a cationic catalyst, an acrylic resin having a weight-average molecular weight of 50,000 to 900,000, conductive particles and solder particles, the acrylic resin containing an acrylic acid at 0.5 to 10 wt %, an acrylic acid ester having a hydroxyl group at 0.5 to 10 wt % and the acrylic resin is contained at 1 to 5 pts. mass with respect to 100 pts. mass of the epoxy compound.

* * * * *